United States Patent
Kalani et al.

(10) Patent No.: US 12,483,257 B2
(45) Date of Patent: Nov. 25, 2025

(54) DYNAMIC CURRENT MISMATCH ACCUMULATION SCHEMES FOR DIGITAL-TO-ANALOG CONVERTERS

(71) Applicant: QUALCOMM Incorporated, San Diego, CA (US)

(72) Inventors: Sarthak Kalani, Santa Clara, CA (US); Andrew Weil, San Diego, CA (US); John Abcarius, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 155 days.

(21) Appl. No.: 18/397,835

(22) Filed: Dec. 27, 2023

(65) Prior Publication Data

US 2025/0219647 A1    Jul. 3, 2025

(51) Int. Cl.
 *H03M 1/10*  (2006.01)
 *H03M 1/06*  (2006.01)
 *H03M 1/08*  (2006.01)
 *H03M 1/74*  (2006.01)

(52) U.S. Cl.
 CPC ....... *H03M 1/1033* (2013.01); *H03M 1/0653* (2013.01); *H03M 1/0863* (2013.01); *H03M 1/1095* (2013.01); *H03M 1/742* (2013.01)

(58) Field of Classification Search
 CPC ............. H03M 1/1033; H03M 1/0653; H03M 1/1095; H03M 1/742; H03M 1/0863
 USPC ......................................... 341/120, 136, 144
 See application file for complete search history.

(56) References Cited

U.S. PATENT DOCUMENTS 9,438,268 B2 *  9/2016  Mitani ................. H03M 3/502
9,509,326 B1 *  11/2016  Kauffman ........... H03M 1/1009

OTHER PUBLICATIONS

International Search Report and Written Opinion—PCT/US2024/057121—ISA/EPO—Mar. 20, 2025.
Tang Y., et al., "A 14 bit 200 MS/s DAC With SFDR greater than 78 dBc, IM3 lesser than-83 dBc and NSD lesser than-163 dBm/Hz Across the Whole Nyquist Band Enabled by Dynamic-Mismatch Mapping", IEEE Journal of Solid-state Circuits, IEEE, USA, vol. 46, No. 6, Apr. 19, 2011, pp. 1371-1381, XP011466971, abstract, Sections IV.A, IV.B and IV.C, figures 9,11,12.

\* cited by examiner

*Primary Examiner* — Khai M Nguyen
(74) *Attorney, Agent, or Firm* — Patterson + Sheridan, L.L.P.

(57) ABSTRACT

Techniques and apparatus for determining dynamic current mismatches in a current-steering digital-to-analog converter (DAC) are provided. One example technique generally includes accumulating current mismatches between a DAC cell of a plurality of DAC cells and a reference cell using a capacitive element and changing a polarity of the capacitive element during the accumulating. The timing of the accumulating may be controlled such that a static current mismatch between the DAC cell and the reference cell is at least reduced and a dynamic current mismatch between the DAC cell and the reference cell is enhanced.

20 Claims, 15 Drawing Sheets

DYNAMIC CURRENT MISMATCH ACCUMULATION SCHEMES FOR DIGITAL-TO-ANALOG CONVERTERS

TECHNICAL FIELD

Certain aspects of the present disclosure generally relate to electronic circuits and, more particularly, to techniques and apparatus for determining dynamic current mismatches to calibrate dynamic nonlinearity of a digital-to-analog converter (DAC).

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include a transmission digital-to-analog converter (TX DAC), which may be used, for example, to convert a digital signal to an analog signal for signal processing (e.g., filtering, upconverting, and amplifying) before transmission by one or more antennas.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure provide a digital-to-analog converter (DAC) circuit. The DAC circuit generally includes a plurality of DAC cells, each DAC cell comprising a current source, a first switch coupled between the current source and a DAC output node, and a second switch coupled between the current source and a complementary DAC output node. The DAC circuit also generally includes a reference cell comprising a reference current source, a third switch coupled between the reference current source and the complementary DAC output node, and a fourth switch coupled between the reference current source and the DAC output node. The DAC circuit further generally includes a capacitive element; an integrator comprising a first input coupled to a first terminal of the capacitive element and a second input coupled to a second terminal of the capacitive element; a first set of switches configured to selectively couple the first terminal of the capacitive element to the DAC output node and the second terminal of the capacitive element to the complementary DAC output node; and a second set of switches configured to selectively couple the second terminal of the capacitive element to the DAC output node and the first terminal of the capacitive element to the complementary DAC output node.

Certain aspects of the present disclosure provide a wireless device. The wireless device includes the DAC circuit as described herein, at least one antenna, and at least one transmit path coupled between the DAC output node and the antenna.

Certain aspects of the present disclosure are directed to a method of DAC calibration. The method generally includes accumulating current mismatches between a DAC cell of a plurality of DAC cells and a reference cell using a capacitive element; and changing a polarity of the capacitive element during the accumulating.

Certain aspects of the present disclosure provide an apparatus capable of digital-to-analog conversion. The apparatus generally includes means for accumulating current mismatches between a DAC cell of a plurality of DAC cells and a reference cell using a capacitive element; and means for changing a polarity of the capacitive element during the accumulating.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure provide techniques and apparatus for determining dynamic nonlinearity of a digital-to-analog converter (DAC) for calibration thereof. Determining dynamic nonlinearity may involve accumulating current mismatches between a DAC cell of a plurality of DAC cells and a reference cell using a capacitive element and changing a polarity of the capacitive element during the accumulating. The timing of the accumulating may be controlled such that a static current mismatch between the DAC cell and the reference cell is at least reduced and a dynamic current mismatch between the DAC cell and the reference cell is enhanced.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
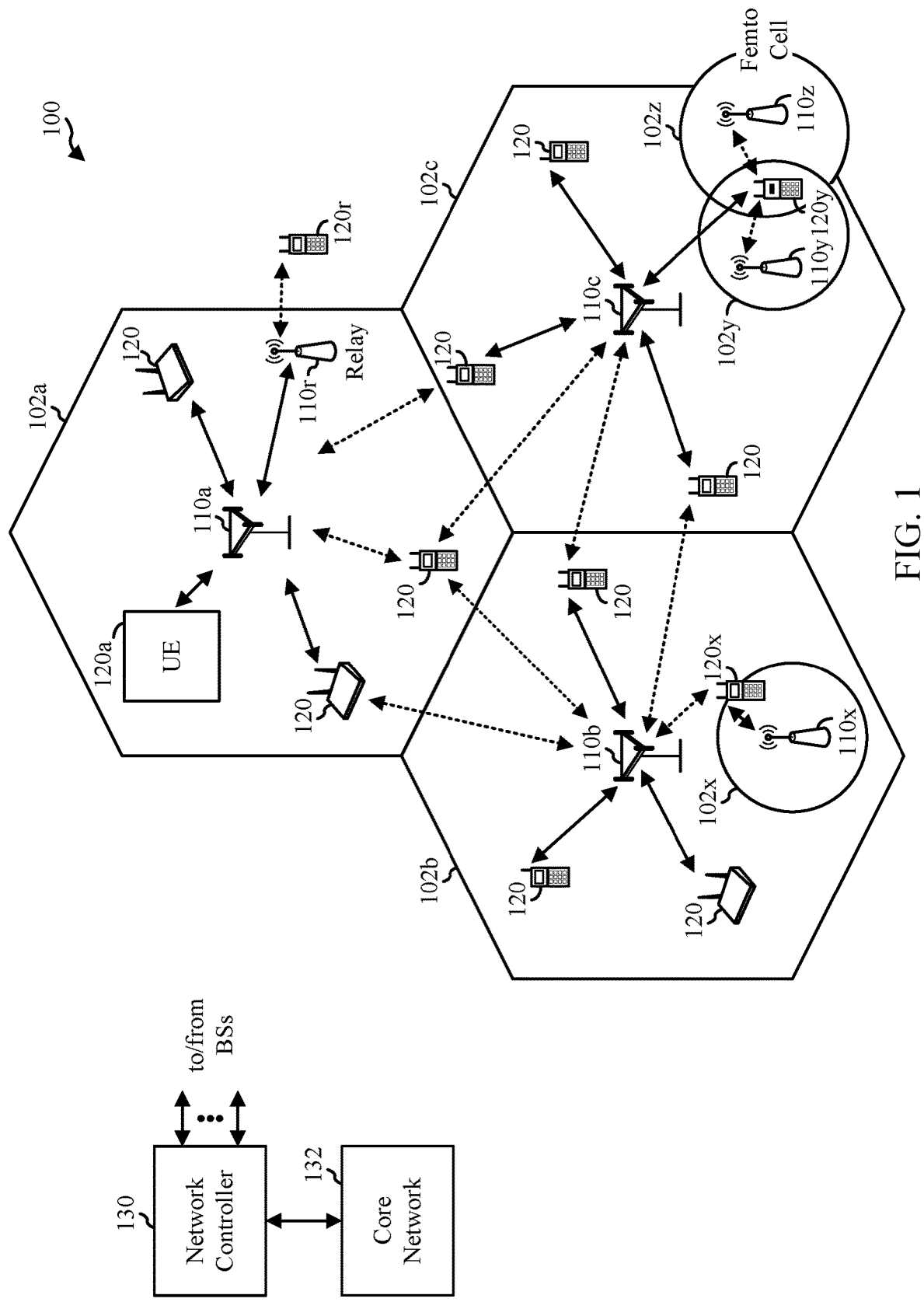
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. A BS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number Nap of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a digital-to-analog converter (DAC) circuit capable of accumulating dynamic current mismatches between each of multiple DAC cells and a reference cell, as described in more detail herein. The dynamic current mismatch accumulation can be used to determine relative time delays between the DAC cells, which can be used to calibrate the DAC circuit for dynamic nonlinearity (e.g., by reordering the DAC cells).

Figure 2:
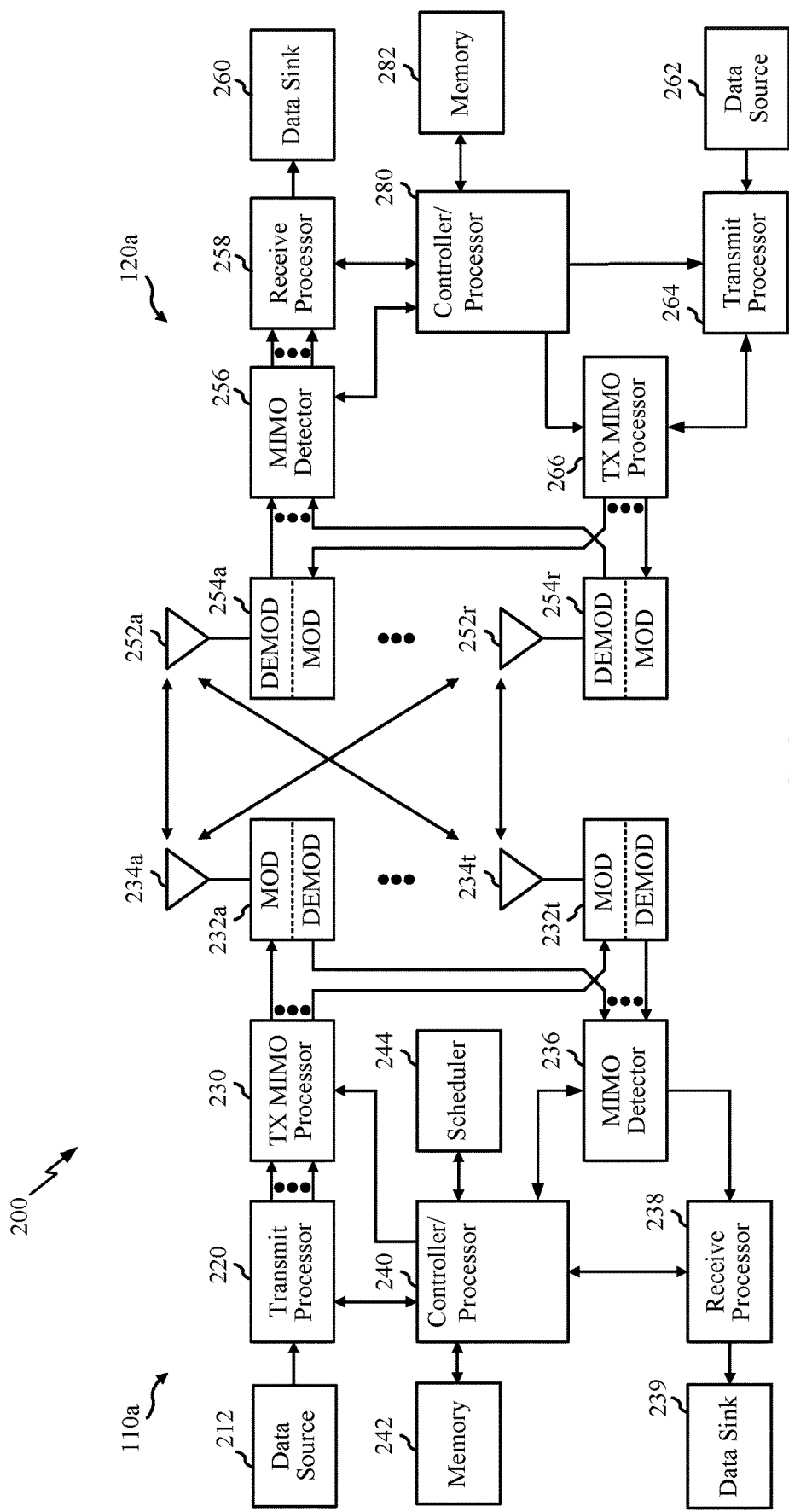
FIG. 2 is a block diagram conceptually illustrating a design of an example base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from all the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include a digital-to-analog converter (DAC) circuit capable of accumulating dynamic current differences between each of multiple DAC unit cells and a reference cell, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
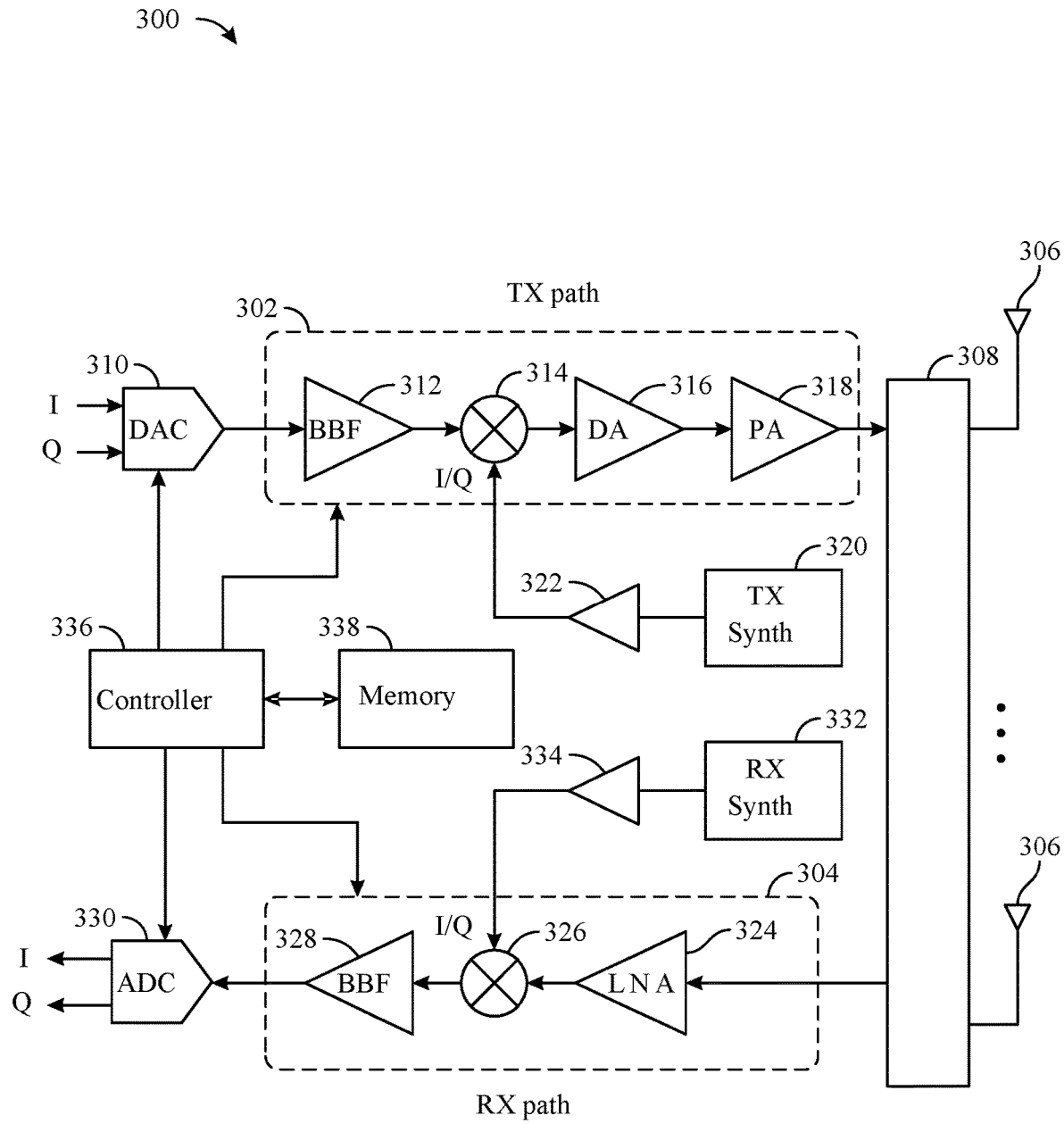
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

For certain aspects, the DAC 310 may be implemented by any of various suitable high-speed DAC topologies, such as a current-steering DAC. For certain aspects, the DAC 310 may be part of a DAC circuit capable of accumulating dynamic current mismatches between each of multiple DAC cells and a reference cell, as described in more detail herein. The dynamic current mismatch accumulation can be used to determine relative time delays between the DAC cells, which can be used to calibrate the DAC circuit for dynamic nonlinearity (e.g., by reordering the DAC cells)..

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for digital-to-analog conversion in any of various other suitable systems (e.g., an audio system or other electronic system).

Example DAC Architecture

Current-steering DACs are one example architecture for high performance digital-to-analog conversion in many wireless transmitters. Current-steering DACs offer versatility of design, high-speed operation, and high performance (such as relatively high linearity). Although current-steering DACs are described as one example type of DAC in which aspects of the present disclosure may be implemented, it is to be understood that aspects of the present disclosure may be applied to other suitable types of DACs, as well.

Figure 4:
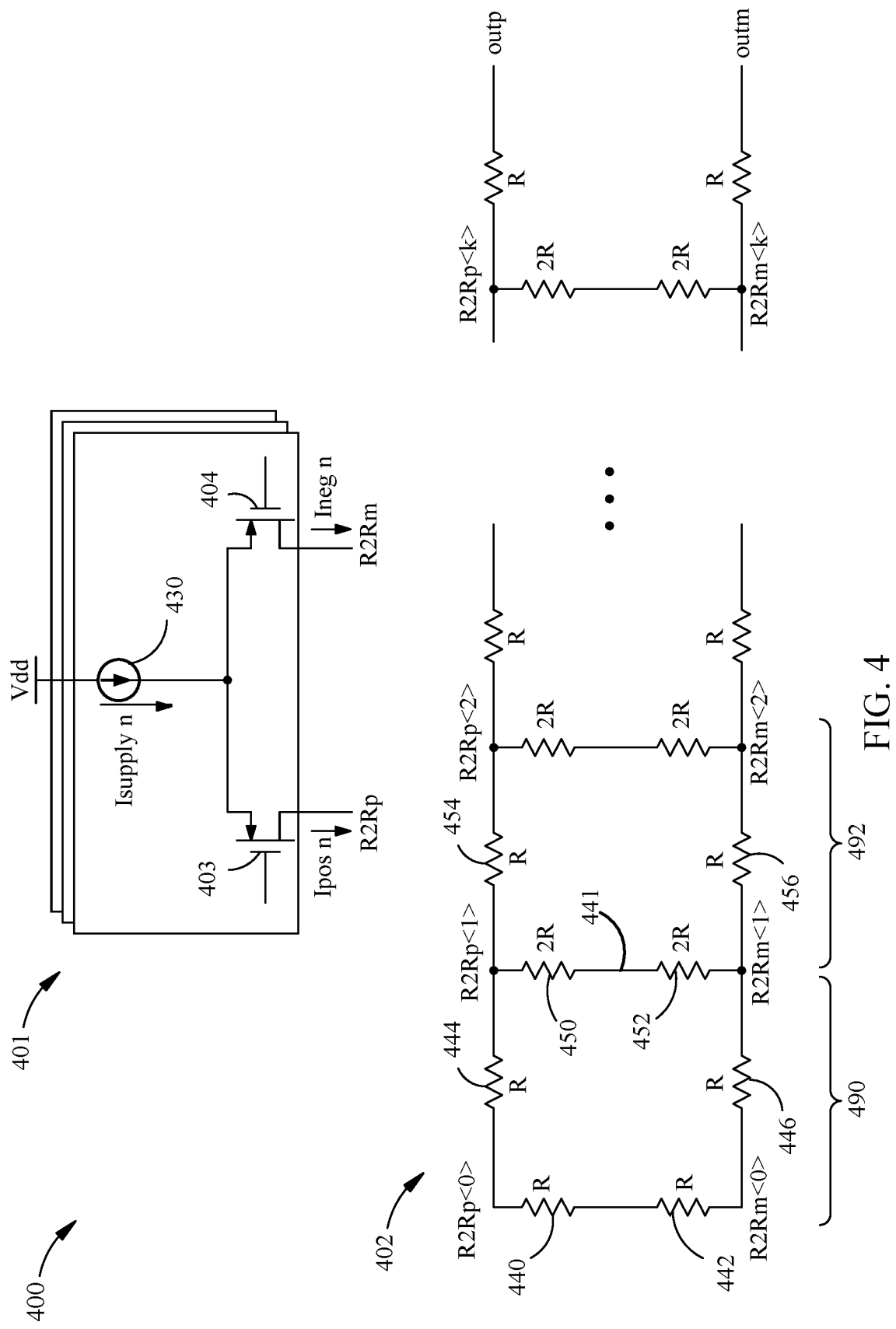
FIG. 4 is a schematic diagram of an example current-steering digital-to-analog converter (DAC), in which aspects of the present disclosure may be practiced.

FIG. 4 is a schematic diagram of an example current-steering DAC 400 (e.g., which may implement the DAC 310 of FIG. 3), in which aspects of the present disclosure may be practiced. As shown, the current-steering DAC 400 includes a number of DAC cells $401_i$ (e.g., current-steering DAC cells i, i being a positive integer, which may be collectively referred to as "DAC cells 401") and a resistor ladder circuit 402. The resistor ladder circuit 402 may be implemented as an R-2R type ladder circuit, as explained below. For example, the resistor ladder circuit 402 may include multiple segments (e.g., segments 490, 492), each of the segments including a positive ladder node R2Rp<0> to R2Rp<k> and a negative ladder node R2Rn<0> to R2Rn<k>. Between the positive ladder node and the negative ladder node of each segment may be resistive elements (e.g., resistive elements 440, 442, or resistive elements 450, 452). Moreover, a resistive element (e.g., resistive element 444 or 454) may be coupled between the positive nodes of adjacent segments of the resistor ladder circuit 402, and a resistive element (e.g., resistive element 446 or 456) may be coupled between the negative nodes of adjacent segments of the resistor ladder circuit 402. In an R-2R ladder circuit, the series resistive elements (e.g., resistive elements 444, 454) have a value of resistance R, and shunt resistive elements (e.g., resistive elements 450, 452 in a shunt branch 441 of the ladder circuit) have double this resistance (2R), in each half of the R-2R ladder circuit. For certain aspects, the least significant bits (LSBs) may follow the R-2R ladder structure, whereas the most significant bits (MSBs) may have different resistance values in the resistor ladder circuit (e.g., according to a thermometer code) or no resistor ladder circuit.

Each of the DAC cells 401 includes a current source 430 coupled to a voltage rail Vdd, a positive switch 403 coupled to the current source and configured to selectively provide a positive current (e.g., Ipos n) to a positive ladder node, and a negative switch 404 coupled to the current source 430 and configured to selectively provide a negative current (e.g., Ineg n) to a negative ladder node. For example, supply current Isupply 0 (e.g., Isupply n, where n is 0) through the current source 430 may be directed via the positive switch 403 to provide a positive current (e.g., Ipos 0) to the positive ladder node R2Rp<0>. Similarly, Isupply 0 through the current source 430 may alternatively be directed via a negative switch 404 to provide a negative current (e.g., Ineg 0) to the negative ladder node R2Rn<0>. In a similar manner, currents from current sources of other DAC cells 401 may be directed via the positive or negative switch in each DAC cell to respective positive and negative ladder nodes (R2Rp<1> to R2Rp<k>, and R2Rm<1> to R2Rm<k>).

The control inputs to the positive switch 403 and the negative switch 404 may be complementary and follow individual bits of the digital input signal provided to the DAC 400 (e.g., by switch drivers (not shown) controlled by a controller, such as controller 336 of FIG. 3). In some aspects, the switches 403 and 404 may be implemented as p-type metal-oxide-semiconductor (PMOS) transistors, as illustrated. Thus, a logic high signal may be used to open switch 403 or 404, and a logic low signal may be used to close switch 403 or 404.

The output signal from the DAC 400 is in the form of a differential current at positive and negative output nodes (labeled "outp" and "outm") of the resistor ladder circuit 402.

Figure 5:
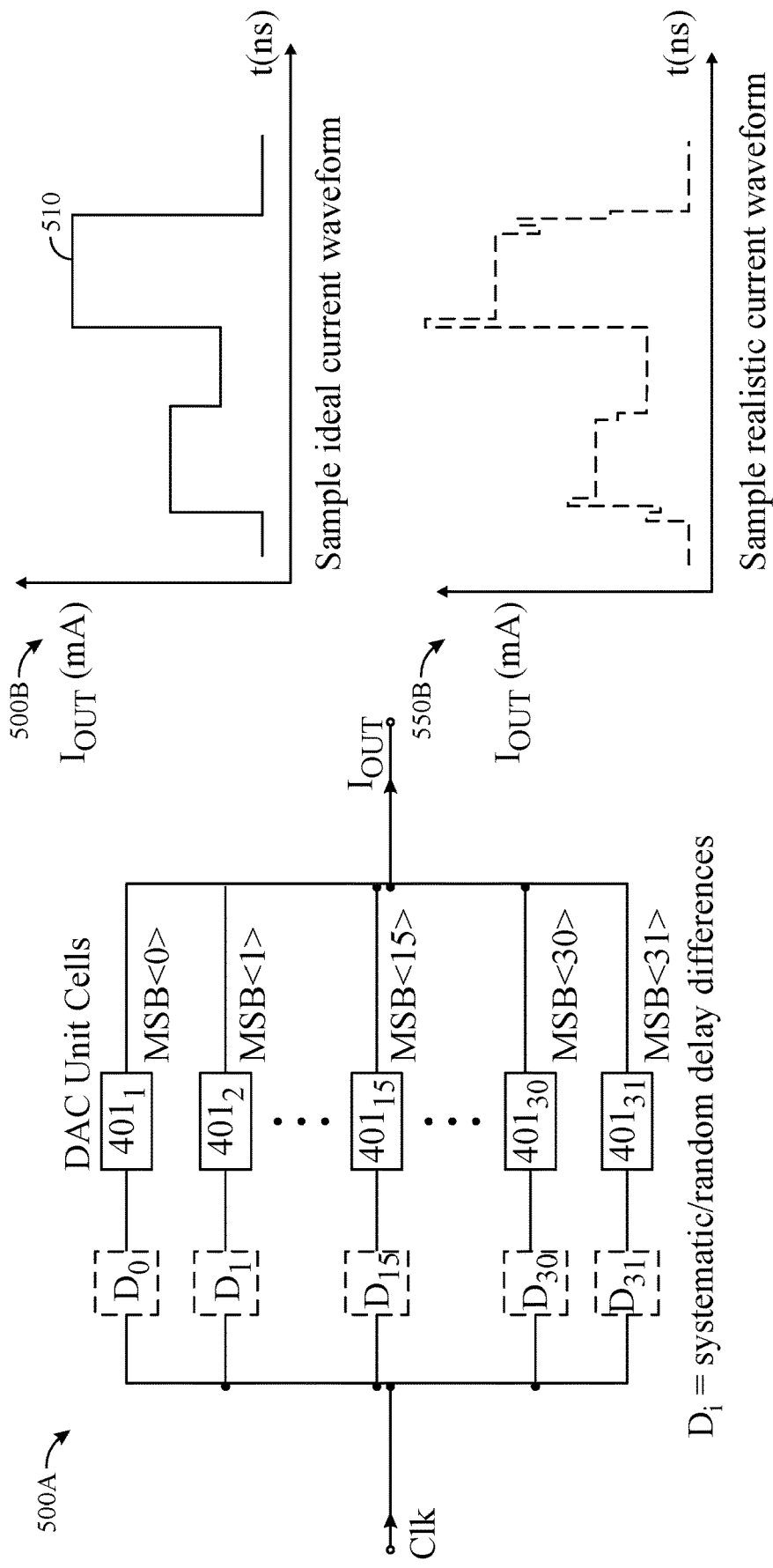
FIG. 5A illustrates example time-delay mismatches between different DAC unit cells in a current-steering DAC.
FIG. 5B illustrates idealistic and realistic graphs of example output current waveforms from a current-steering DAC over time.

One of the challenges commonly associated with current-steering DACs is the presence of random and/or systematic time-delay mismatches between DAC unit cells (e.g., DAC cells 401). FIG. 5A illustrates example delays associated with different DAC cells in a current-steering DAC (e.g., current-steering DAC 400). Each of the DAC cells 401 (labeled "DAC Unit Cells" in FIG. 5A) included in the current-steering DAC 400 may represent a different bit for the current-steering DAC 400, where the DAC cells 401 shown in FIG. 5A are most significant bit (MSB) cells. As shown, each of the DAC cells 401 may be associated with a relative time delay (e.g., delay n, n being a positive integer), as illustrated. For example, DAC cell $401_1$ may be associated with a relative delay $D_0$ that may be smaller, larger, or the same as a relative delay $D_{15}$ associated with DAC cell $401_{15}$. This time-delay mismatch between DAC cells may be due, for example, to different routing lengths and/or different parasitic capacitances for the various traces associated with the clock (labeled "Clk") and control signals (not shown) routed to the different DAC cells. The output current signal from the current-steering DAC is represented by the current-summed signal labeled "$I_{OUT}$."

FIG. 5B illustrates graphs 500B, 550B of example output current waveforms of a current-steering DAC over time. Graph 500B illustrates an example idealistic current waveform 510 (labeled "Sample ideal current waveform") generated by a current-steering DAC (e.g., the DAC 400), where the different output currents settle infinitely fast and there is no distortion when transitioning between different output current levels. However, a more realistic output current waveform 520 (labeled "Sample realistic current waveform") illustrated in graph 550B includes a number of non-idealities, which are most noticeable at transitions between different output current levels. At least some of these non-idealities may result from deterministic and random timing mismatches between DAC cells 401 (in which certain DAC cells transition earlier and certain other DAC cells transition later in time), which is responsible for dynamic nonlinearity and may cause harmonic distortion (e.g., second-order harmonic distortion (HD2) and/or third-order harmonic distortion (HD3)). The presence of harmonic distortion in the operation of the current-steering DAC limits DAC performance (e.g., by reducing the achievable signal-to-noise-and-distortion ratio (SNDR) of the current-steering DAC).

Example DAC Calibration Circuitry and Techniques for Determining DAC Dynamic Nonlinearity Certain aspects of the present disclosure are directed to determining the relative time delay between each of a plurality of DAC cells and a reference cell in a current-steering DAC. The reference cell may be one of the DAC cells designated for this delay determination or may be an additional DAC cell, separate from the DAC cells used in operating the current-steering DAC. Ideally, the relative time delays may be obtained by integrating the dynamic current mismatches between each of the DAC cells and the reference cell using an integrator and a capacitive element, where the integrated charge on the capacitive element represents the time delay. Once the relative delays of the different DAC cells are determined (and ranked from shortest to longest, or vice versa, to generate an order of delays), then the DAC cells may be effectively reordered during operation to compensate for, at least reduce the effects of, the dynamic nonlinearity caused by the timing mismatch between the DAC cells. In this manner, the dynamic nonlinearity (e.g., the harmonic distortion) in the current-steering DAC may be reduced, and the performance (e.g., the SNDR) of the current-steering DAC may be improved.

However, in accumulating the current mismatches between each DAC cell and the reference cell, the residual static current mismatch may add up faster than the dynamic current mismatch and may overpower the dynamic current mismatch. In addition, the dynamic current mismatch during rising and falling transitions are in opposite directions and may be canceled, or at least nearly so. However, the dynamic current mismatch is of interest for determining the dynamic nonlinearity of the current-steering DAC.

Accordingly, certain aspects of the present disclosure are directed to switching the polarity of the capacitive element during the integration in an effort to cancel the static current mismatch and integrate the dynamic current mismatch when comparing each of the DAC cells to the reference cell. By switching the current integration polarity and accurately controlling the timing of the switches used to accumulate the current mismatches and the polarity flipping, the dynamic current mismatches between each of the DAC cells and the reference cell may be accumulated, and the relative time-delay values may be determined therefrom, to accurately determine the dynamic nonlinearity.

Figure 6:
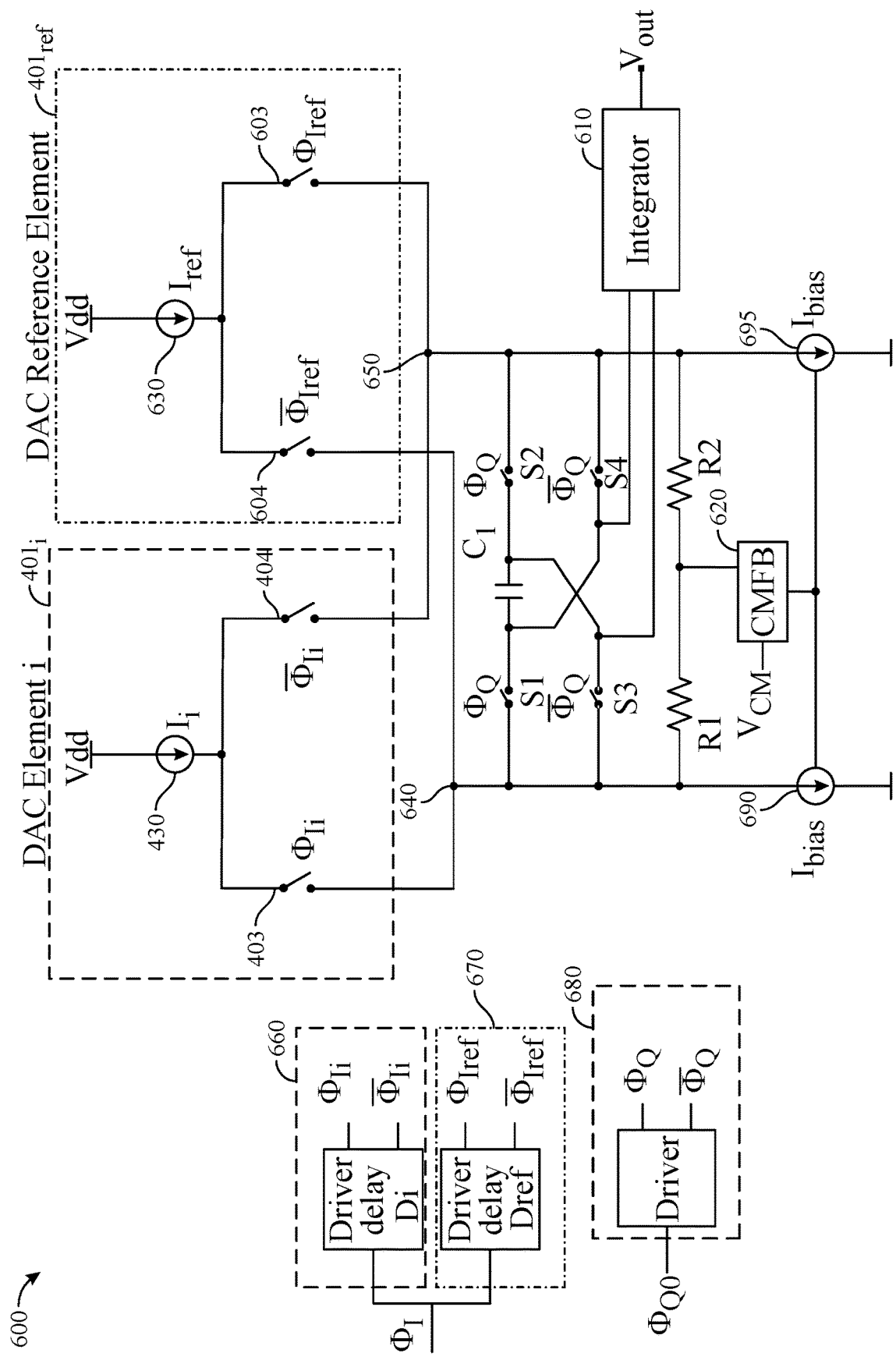
FIG. 6 is a circuit diagram of an example DAC circuit for measuring relative delay differences between DAC elements of a current-steering DAC, in accordance with certain aspects of the present disclosure.

FIG. 6 is a circuit diagram of an example DAC circuit 600 for measuring relative delay differences between DAC elements of a current-steering DAC, in accordance with certain aspects of the present disclosure. The DAC circuit 600 may include the plurality of DAC cells $401_i$ (labeled "DAC Element i"), a reference cell $401_{ref}$ (labeled "DAC Reference Element"), a capacitive element C1, an integrator 610 (labeled "Integrator"), a common-mode feedback (CMFB) circuit 620 (labeled "CMFB"), a first switch S1 (receiving a control signal labeled "ΦQ"), a second switch S2 (receiving a control signal labeled "ΦQ"), a third switch S3 (receiving a control signal labeled "$Φ_Q$_bar"), and a fourth switch S4 (receiving a control signal labeled "ΦQ_bar"). The capacitive element C1, the integrator 610, the CMFB circuit 620, the first switch S1, the second switch S2, the third switch S3, and the fourth switch S4 (which may collectively be referred to as "calibration circuitry") may collectively be coupled to the plurality of DAC cells 401; and the reference cell $401_{ref}$ through outputs of the plurality of DAC cells 401; and the reference cell $401_{ref}$, as shown.

As described above, each of the DAC cells 401 may include a positive switch 403 (receiving a control signal labeled "$Φ_{Ii}$"), a negative switch 404 (receiving a control signal labeled "$Φ_{Ii}$_bar"), and a current source 430 coupled to the voltage rail Vdd. The positive switch 403 may be coupled between the current source 430 and a DAC output node 640, and the negative switch 404 may be coupled between the current source and a complementary DAC output node 650.

The reference cell $401_{ref}$ may be similar to the DAC cells 401, and may include a reference positive switch 603 (similar to the positive switch 403, but receiving a control signal labeled "$Φ_{Iref}$"), a reference negative switch 604 (similar to the negative switch 404, but receiving a control signal labeled "$Φ_{Iref}$_bar"), and a reference current source 630 (similar to the current source 430) coupled to the voltage rail Vdd. The reference positive switch 603 may be coupled between the reference current source 630 and the complementary DAC output node 650, and the reference negative switch 604 may be coupled between the reference current source 630 and the DAC output node 640. In certain aspects, the reference cell $401_{ref}$ may be one of the plurality of DAC cells 401 and remain as such during the current comparison of each of the DAC cells to this designated reference cell.

The integrator 610 may include a first input coupled to a first terminal of the capacitive element C1, a second input coupled to a second terminal of the capacitive element C1 (e.g., differential inputs), and an output coupled to an output voltage node (labeled "Vout"). The integrator 610 may be configured to integrate the current on the capacitive element C1.

A first input of the CMFB circuit 620 may be coupled to the DAC output node 640 through a resistor R1 and the complementary DAC output node 650 through a resistor R2. A second input of the CMFB circuit 620 may be configured to receive a common-mode bias voltage (labeled "$V_{cm}$") for the DAC circuit 600. The output of the CMFB circuit 620 may be coupled to a control input of a first current sink 690 (labeled "$I_{bias}$") and to a control input of a second current sink 695 (labeled "$I_{bias}$")). In this manner, the CMFB circuit 620 may be configured to control the current sinks 690, 692 based on the voltage at the first input to achieve the desired common-mode bias (e.g., $V_{cm}$) for the DAC circuit 600.

The first switch S1 and the second switch S2 (collectively referred to as the "first set of switches") may be configured to selectively couple the first terminal of the capacitive element C1 to the DAC output node 640 and the second terminal of the capacitive element C1 to the complementary DAC output node 650, as illustrated. The third switch S3 and the fourth switch S4 (collectively referred to as the "second set of switches") may be configured to selectively couple the second terminal of the capacitive element to the DAC output node 640 and the first terminal of the capacitive element to the complementary DAC output node 650.

The DAC circuit 600 may also include a first switch driver 660, a second switch driver 670, and a third switch driver 680. Each of the drivers 660, 670, and 680 may be implemented as delay (D) flip-flop with a single input and a complementary pair of outputs (Q and Q_bar). Each of the drivers 660, 670, and 680 may be configured to receive a control signal (e.g., a clock signal) and generate the output signals (e.g., complementary output signals) that drive the control input(s) of one or more switches (e.g., the gates of transistors implementing the switches). The control signals may be generated by and output from a controller, such as controller 336 of FIG. 3. The first driver 660 may be configured to control the positive switch 403 and the negative switch 404 of the DAC cell $401_i$ using control signals $\Phi_{I_i}$ and $\Phi_{I_i}$_bar, respectively, which are based on a first control/clock signal (labeled "$\Phi_I$"). The second driver 670 may be configured to control the reference positive switch 603 and the reference negative switch 604 of the reference cell $401_{ref}$ using control signals $\Phi_{Iref}$ and $\Phi_{Iref}$_bar, respectively, which are also based on the first control/clock signal ($\Phi_I$), but may have a longer delay than the control signals $\Phi_{I_i}$ and $\Phi_{I_i}$_bar (as illustrated in FIGS. 8A-8F). The third driver 680 may be configured to control the first set of switches S1, S2 and the second set of switches S3, S4 using control signals $\Phi_Q$ and $\Phi_Q$_bar, respectively, which are based on a second control/clock signal (labeled "$\Phi_{QO}$"). The first driver 660 may be associated with a driver delay $D_i$, and the second driver 670 may be associated with a driver delay $D_{ref}$. In certain aspects, the second control/clock signal $\Phi_{QO}$ may have a quadrature relationship (e.g., a 90° or a 270° phase shift) with the first control/clock signal $\Phi_I$ or its complement $\Phi_I$_bar (as shown in the timing diagram 800F of FIG. 8F).

In certain aspects, a wireless device (e.g., a BS 110 or a UE 120) may include a DAC circuit (e.g., the DAC circuit 600 of FIG. 6) with switches (e.g., the first set of switches S1, S2 and the second set of switches S3, S4) for changing capacitor polarity during current mismatch accumulation. This wireless device may further include at least one antenna (e.g., antenna(s) 306) and at least one transmit path (e.g., transmit path 302) coupled between a DAC output node (e.g., the DAC output node 640 and/or 650) and the antenna.

Example Operations for Dynamic Current Mismatch Accumulation

Figure 7:
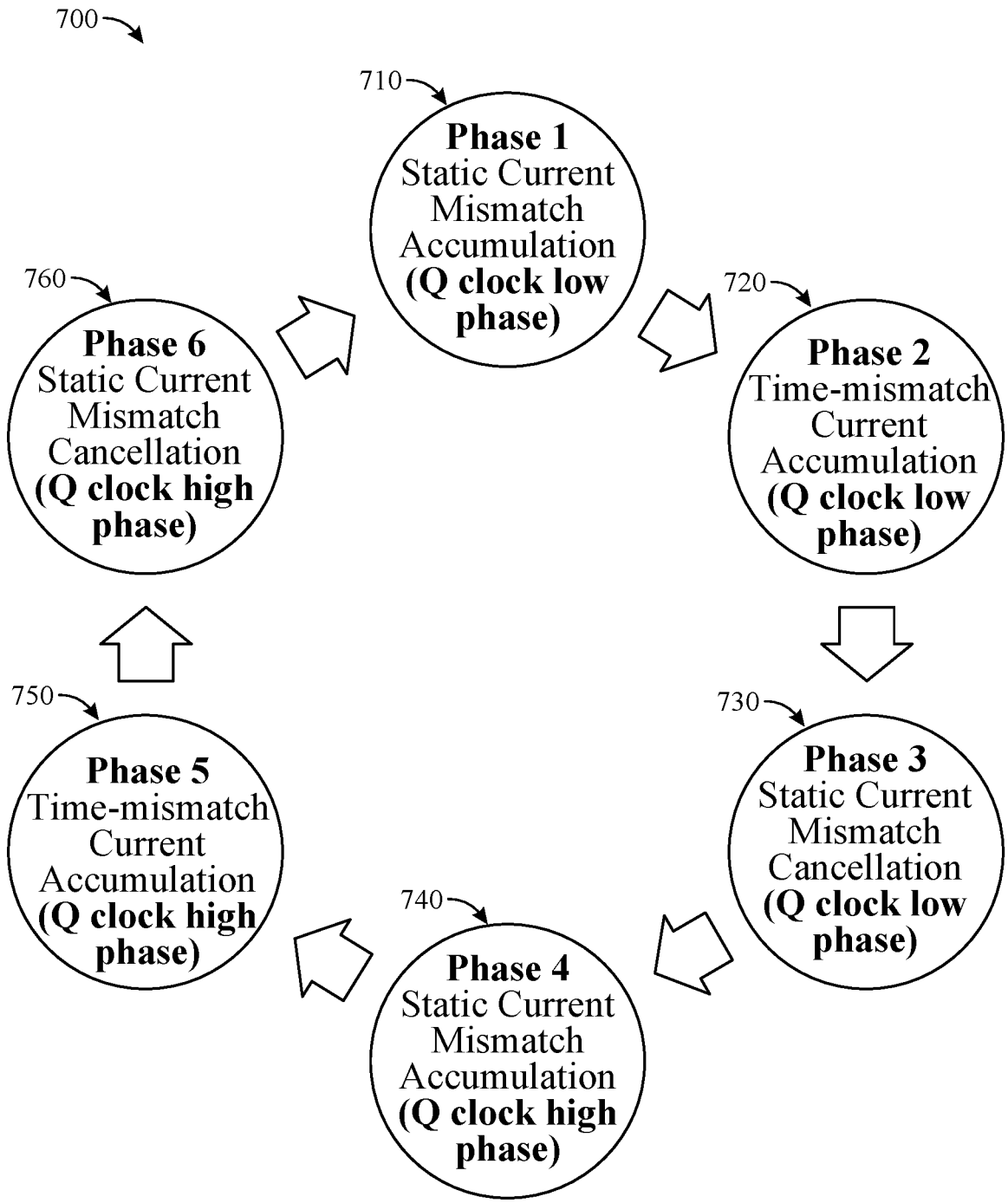
FIG. 7 is a phase sequence diagram illustrating example operations for dynamic current mismatch accumulation, in accordance with certain aspects of the present disclosure.

FIG. 7 is a phase sequence diagram illustrating example operations 700 for dynamic current mismatch accumulation, in accordance with certain aspects of the present disclosure. The operations 700 may be facilitated, for example, by control signals (e.g., control/clock signals $\Phi_I$ and $\Phi_{QO}$) and one or more drivers (e.g., the first driver 660, the second driver 670, and/or the third driver 680) of the DAC circuit 600. FIGS. 8A-F illustrate the example DAC circuit 600 of FIG. 6 in different phases during the example operations 700 of FIG. 7, in accordance with certain aspects of the present disclosure. Therefore, FIGS. 7 and 8A-F are herein described together for clarity. In certain aspects, the operations 700 may be used to determine dynamic non-linearity of a current-steering DAC, which may occur during calibration of this DAC. The operations 700 may be performed for each DAC cell $401_i$ of the plurality of DAC cells 401. The same reference cell $401_{ref}$ may be utilized as the reference element for comparing with each DAC cell $401_i$.

Figure 8A:
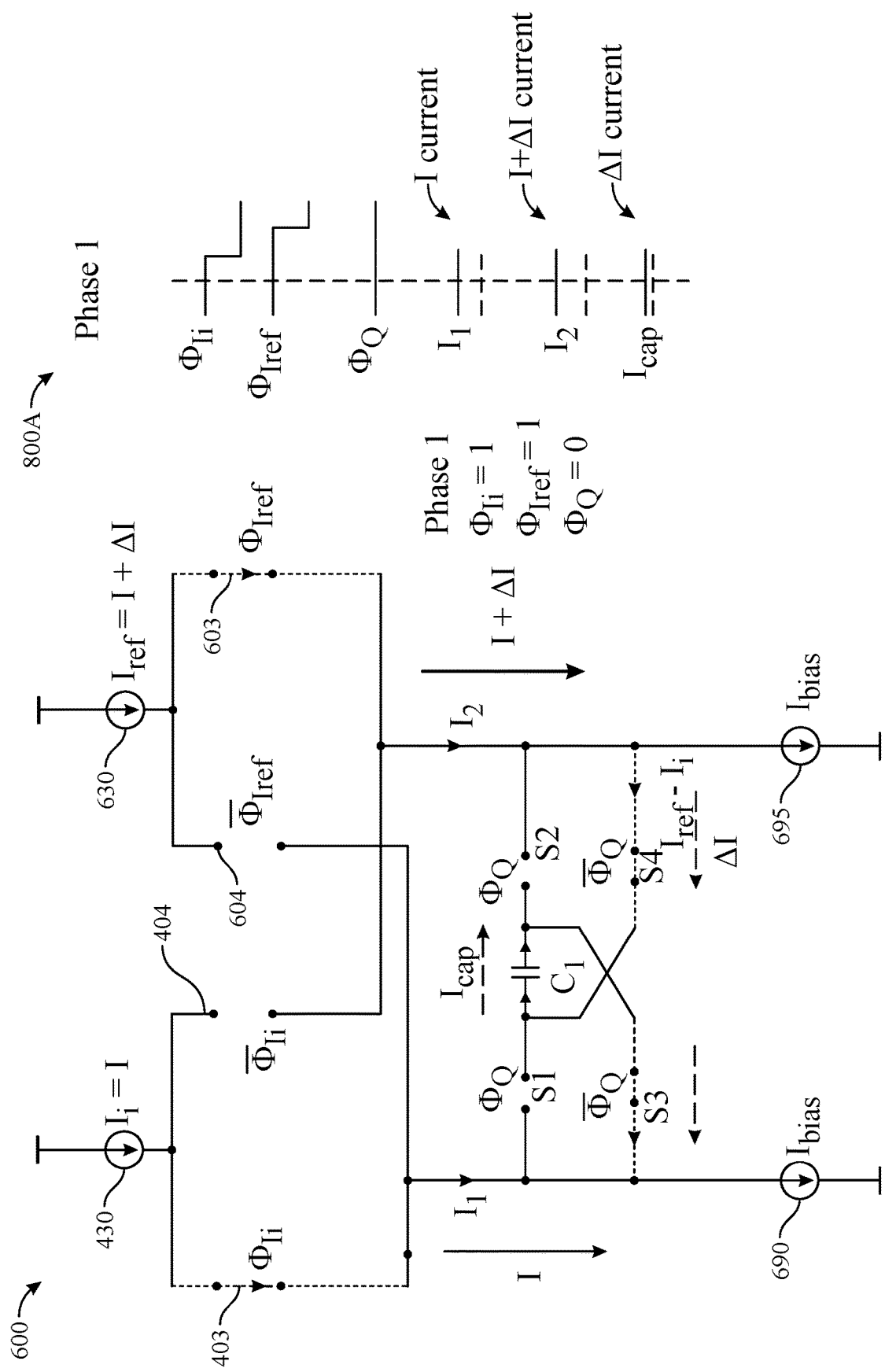
FIGS. 8A-F illustrate the example DAC circuit of FIG. 6 in different phases during the example operations of FIG. 7, in accordance with certain aspects of the present disclosure.

The operations 700 may begin at a first phase 710, which involves static current mismatch accumulation with control signal $\Phi_Q$ being logic low. As shown in the timing diagram 800A of FIG. 8A for the first phase 710, the control signal ($_1$; output by the first driver 660 is logic high, the control signal $\Phi_1$ref output by the second driver 670 is logic high, and the control signal $\Phi_Q$ output by the third driver 680 is logic low during the first phase 710. The complements of these control signals (e.g., ($\Phi_{I_i}$_bar, $\Phi_{Iref}$_bar, and $\Phi_Q$_bar) would have the respective opposite logic, in all phases of the operations 700. As a result, the positive switch 403, the reference positive switch 603, and the second set of switches S3, S4 are closed, and the negative switch 404, the reference negative switch 604, and the first set of switches S1, S2 are open, as shown in the DAC circuit 600 illustrated in FIG. 8A. Assuming the current source 430 of the DAC cell 401; has an example current $I_i$=I and the reference current source 630 has an example current $I_{ref}$=I+$\Delta$I, then in the first phase 710, the current $I_1$ in the first branch of the DAC circuit 600 will be I, and the current $I_2$ in the second branch of the DAC circuit 600 will be I+$\Delta$I, as illustrated in FIG. 8A. Thus, in the first phase 710, the capacitive element C1 may have a current $I_{cap}$=$\Delta$I (=$I_2$-$I_1$) flowing from the first terminal to the second terminal, representing a first static current mismatch (e.g., $\Delta$I=$I_{ref}$-$I_i$) between the current source 430 of the DAC cell 401; and the reference current source 630, as shown in the timing diagram 800A.

Figure 8B:
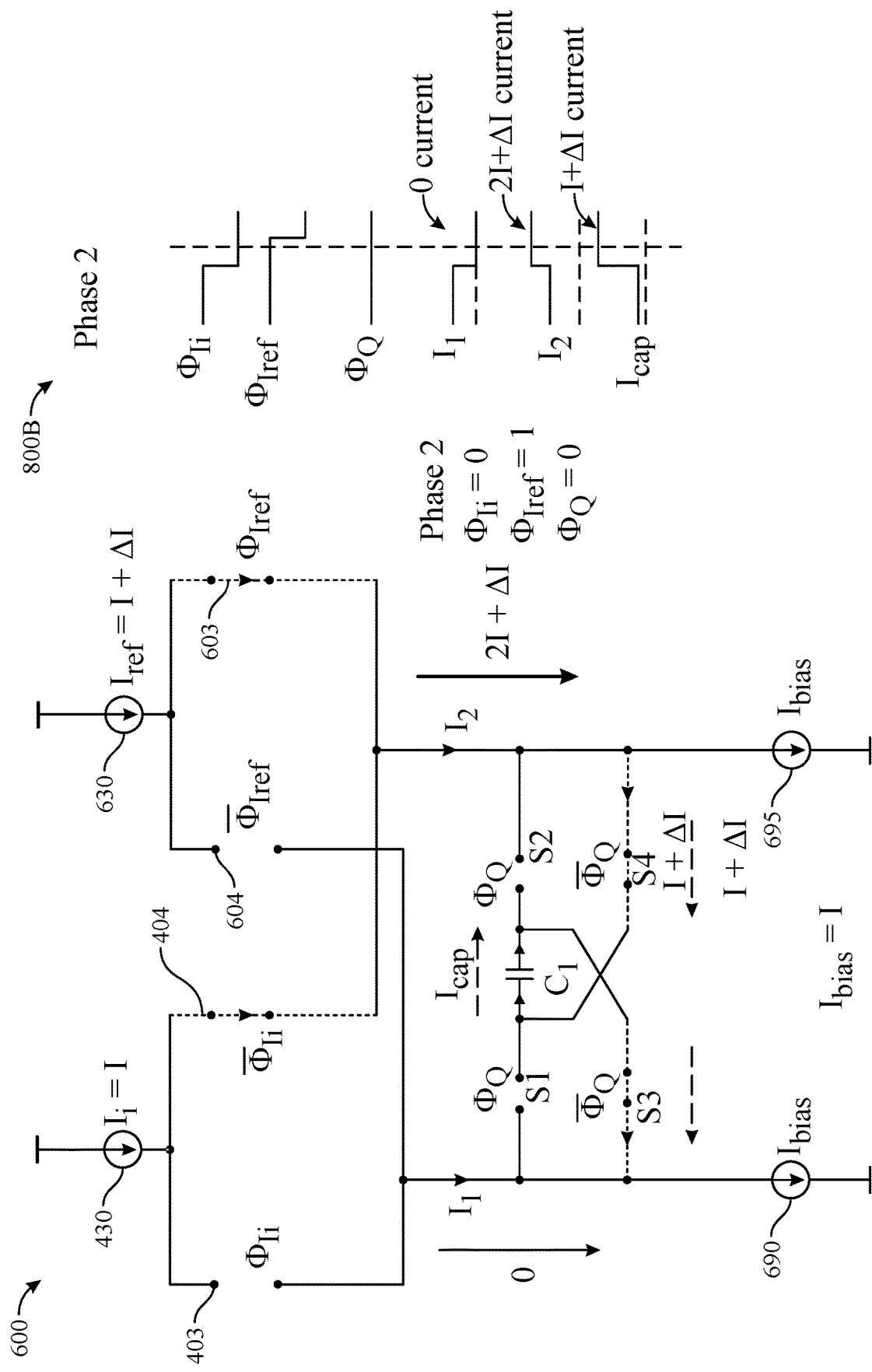

After the first phase 710, the operations 700 may proceed to a second phase 720, which involves time-mismatch-based current accumulation with control signal (DQ being logic low. As shown in the timing diagram 800B of FIG. 8B for the second phase 720, the control signal $\Phi_{I_i}$ output by the first driver 660 has changed to logic low, the control signal $\Phi_{Iref}$ output by the second driver 670 remains logic high, and the control signal $\Phi_Q$ output by the third driver 680 remains logic low. As a result, the negative switch 404, the reference positive switch 603, and the second set of switches S3, S4 are closed, and the positive switch 403, the reference negative switch 604, and the first set of switches S1, S2 are open, as shown in the DAC circuit 600 illustrated in FIG. 8B. In this case, keeping with the same assumptions as above, the current $I_1$ in the first branch of the DAC circuit 600 will be zero, and the current $I_2$ in the second branch of the DAC circuit 600 will be 2I+$\Delta$I, as illustrated in FIG. 8B. Thus, in the second phase 720, the capacitive element C1 may have a current $I_{cap}$=2I+$\Delta$I (=$I_2$-$I_1$) flowing from the first terminal to the second terminal, representing a first dynamic current mismatch (e.g., 2I+$\Delta$I=$I_{ref}$+$I_i$) between the current source 430 of the DAC cell 401; and the reference current source 630, as shown in the timing diagram 800B.

Figure 8C:
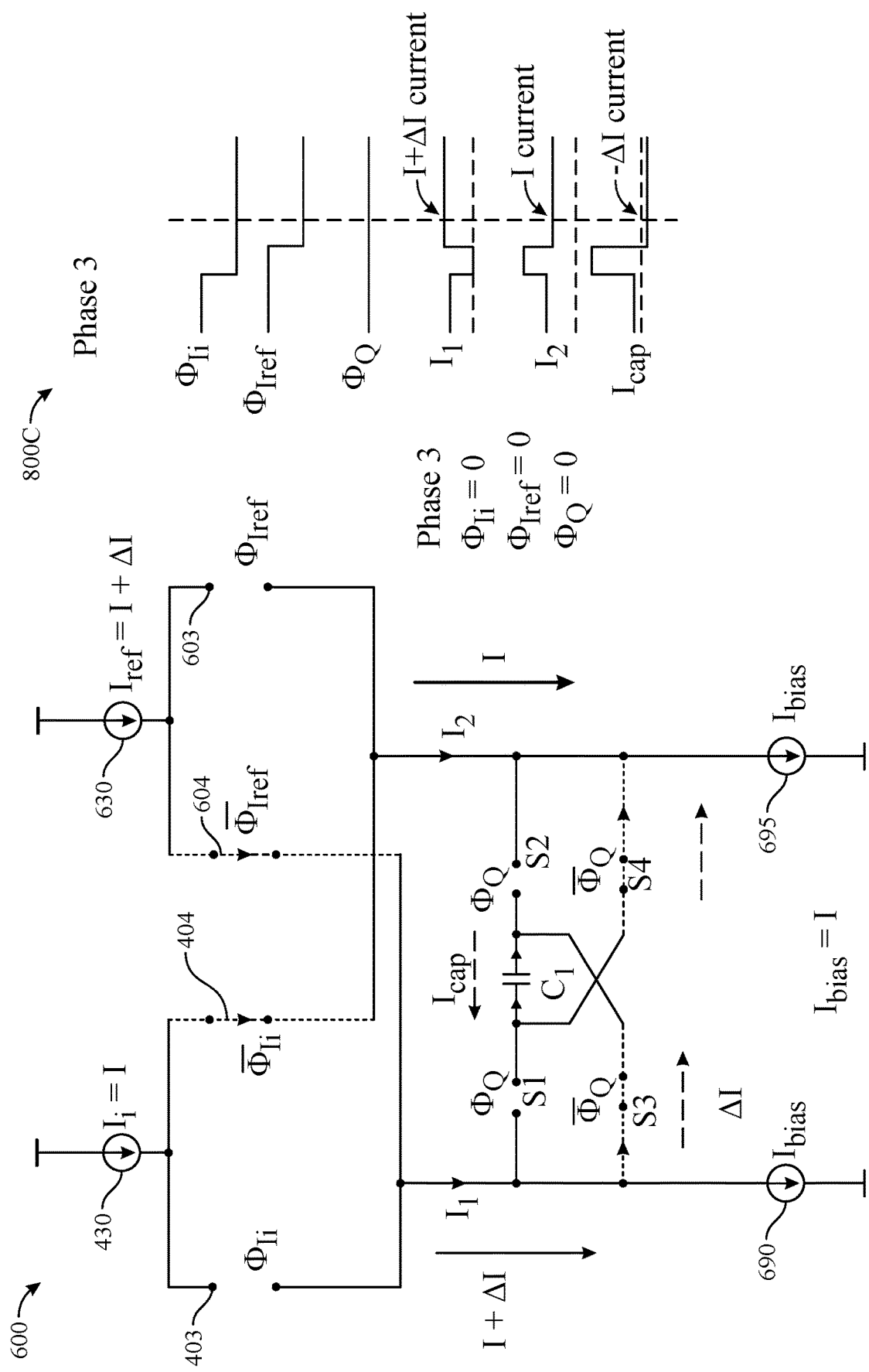

After the second phase 720, the operations 700 may proceed to a third phase 730, which involves static current mismatch cancellation with the static current mismatch accumulation from the first phase 710, with control signal $\Phi_Q$ being logic low. As shown in the timing diagram 800C of FIG. 8C for the third phase 730, the control signal $\Phi_{I_i}$ output by the first driver 660 remains logic low, the control signal $\Phi_{Iref}$ output by the second driver 670 has changed to logic low, and the control signal (Q output by the third driver 680 remains logic low. As a result, the negative switch 404, the reference negative switch 604, and the second set of switches S3, S4 are closed, and the positive switch 403, the reference positive switch 603, and the first set of switches S1, S2 are open, as shown in the DAC circuit 600 illustrated in FIG. 8C. In this case, keeping with the same assumptions as above, the current $I_1$ in the first branch of the DAC circuit 600 will be I+$\Delta$I, and the current $I_2$ in the second branch of the DAC circuit 600 will be I, as illustrated in FIG. 8C. Thus, in the third phase 730, the capacitive element C1 may have a current $I_{cap}$=-$\Delta$I(=$I_2$-$I_1$) flowing from the first terminal to the second terminal, representing a second static current mismatch (e.g., -$\Delta$I=$I_i$-$I_{ref}$) between the current source 430 of the DAC cell $401_i$ and the reference current source 630, as shown in the timing diagram 800C. The second static current mismatch from the third phase 730 may have nearly equal magnitude as, but opposite polarity to, the first static current mismatch from the first phase 710, such that the second static current mismatch cancels, or at least reduces, an effect of the first static current mismatch in the integration, if the lengths of the phases 710, 730 are controlled to be the same.

Figure 8D:
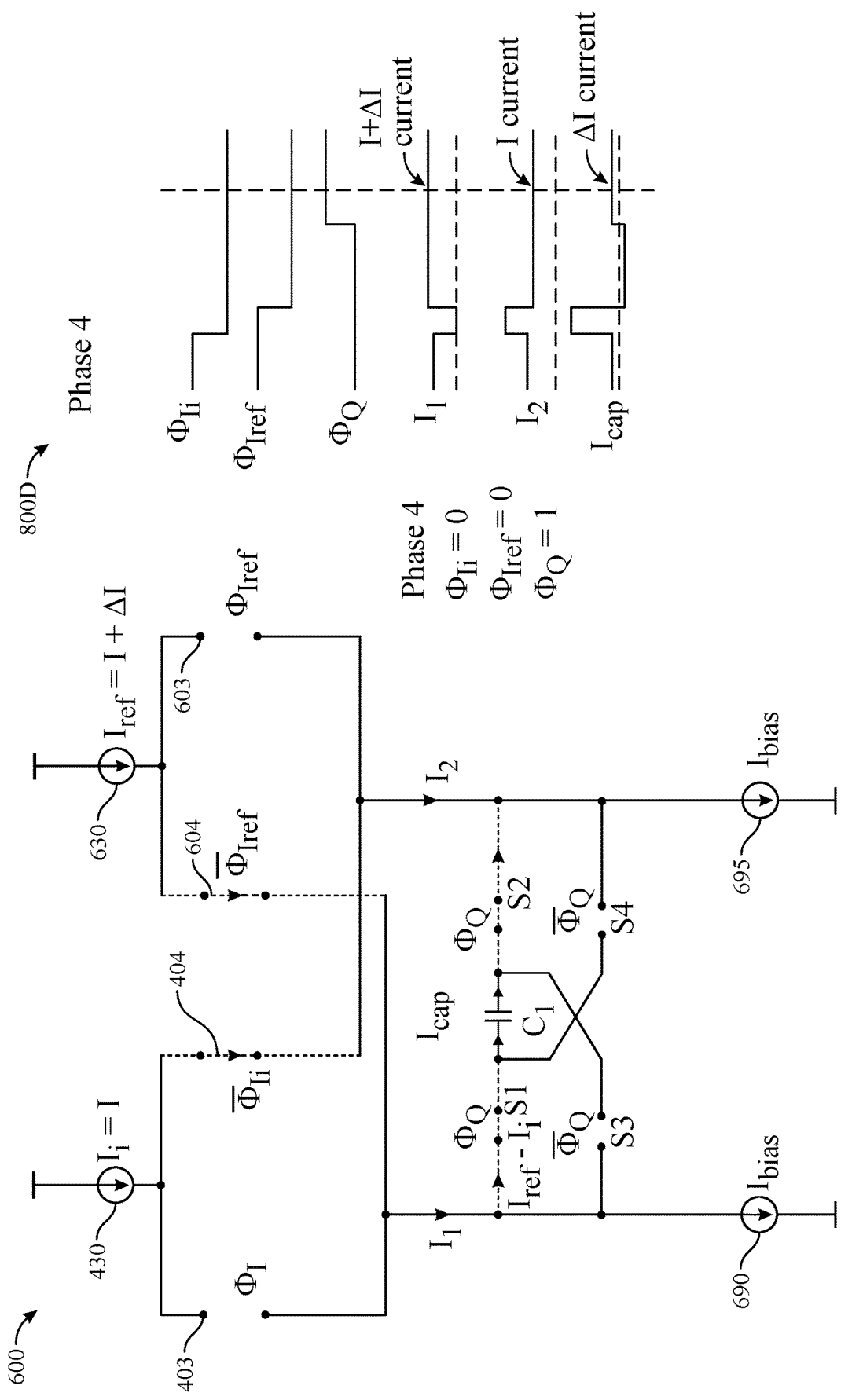

After the third phase 730, the operations 700 may proceed to a fourth phase 740, which involves static current mismatch accumulation with control signal (Q being logic high. As shown in the timing diagram 800D of FIG. 8D for the fourth phase 740, the control signal $\Phi_{I_i}$ output by the first driver 660 remains logic low, the control signal $\Phi_{I_{ref}}$ output by the second driver 670 remains logic low, and the control signal $\Phi_Q$ output by the third driver 680 has changed to logic high. As a result, the negative switch 404, the reference negative switch 604, and the first set of switches S1, S2 are closed, and the positive switch 403, the reference positive switch 603, and the second set of switches S3, S4 are open, as shown in the DAC circuit 600 illustrated in FIG. 8D. With the control signal $\Phi_Q$ now being logic high (and the control signal $\Phi_Q$_bar now being logic low) and the first set of switches now being closed (and the second set of switches being open), the polarity of the capacitance element has been flipped in the DAC circuit 600, with respect to the nodes 640, 650, effectively switching the current integration polarity. In this case, keeping with the same assumptions as above, the current $I_1$ in the first branch of the DAC circuit 600 will be I+ΔI, and the current $I_2$ in the second branch of the DAC circuit 600 will be I, as illustrated in FIG. 8D. Thus, in the fourth phase 740, the capacitive element C1 may have a current $I_{cap}$=ΔI(=$I_1$-$I_2$) flowing from the first terminal to the second terminal, representing a third static current mismatch (e.g., ΔI=$I_{ref}$-$I_i$) between the current source 430 of the DAC cell 401; and the reference current source 630, as shown in the timing diagram 800D.

Figure 8E:
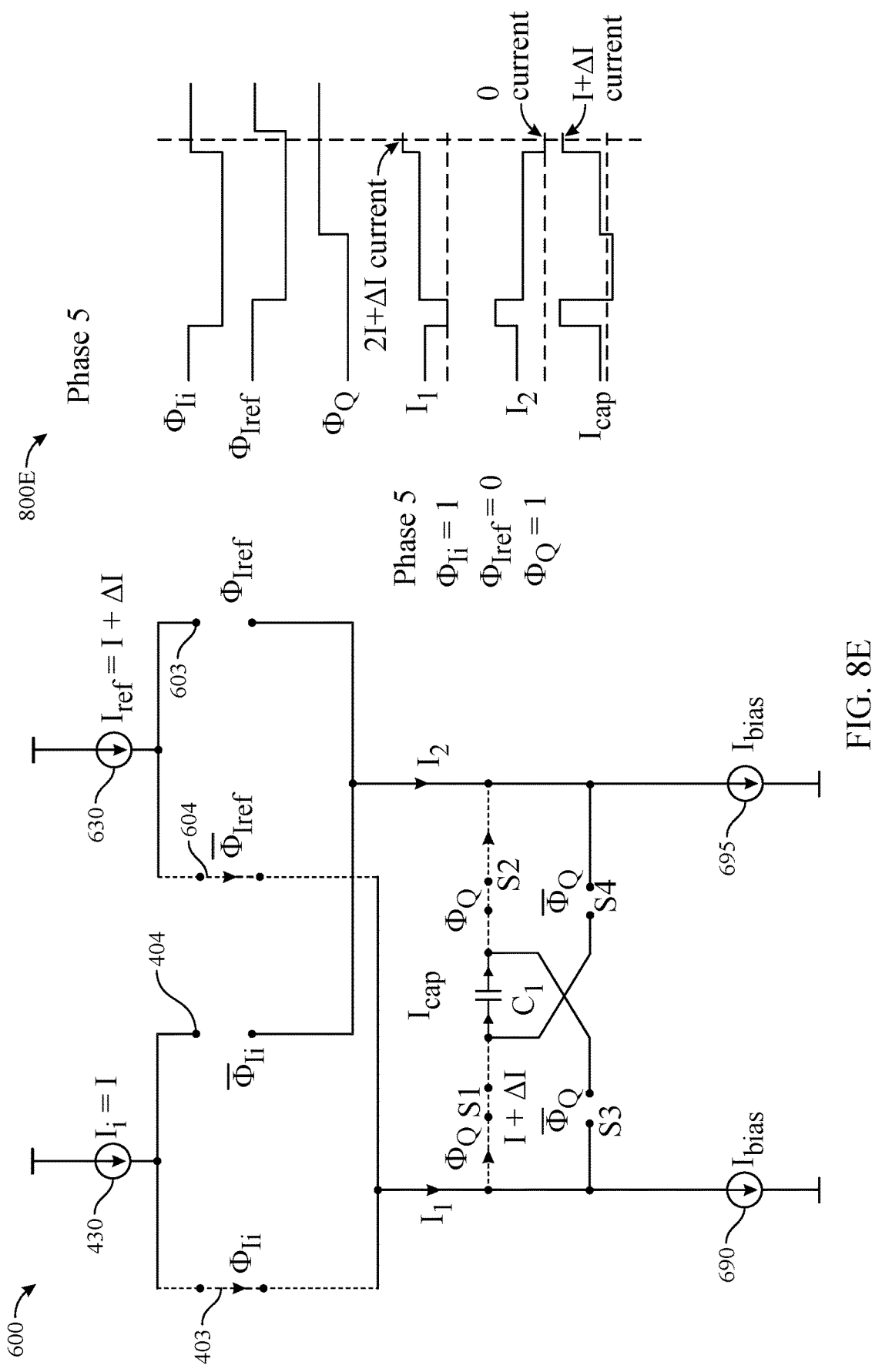

After the fourth phase 740, the operations 700 may proceed to a fifth phase 750, which involves time-mismatch-based current accumulation with control signal $\Phi_Q$ being logic high. As shown in the timing diagram 800E of FIG. 8E for the fifth phase 750, the control signal $\Phi_{I_i}$ output by the first driver 660 changes to logic high, the control signal $\Phi_{I_{ref}}$ output by the second driver 670 (e.g., $\Phi_{ref}$) remains logic low, and the control signal $\Phi_Q$ output by the third driver 680 remains logic high. As a result, the positive switch 403, the reference negative switch 604, and the first set of switches S1, S2 are closed, and the negative switch 404, the reference positive switch 603, and the second set of switches S3, S4 are open, as shown in the DAC circuit 600 illustrated in FIG. 8E. In this case, keeping with the same assumptions as above, the current $I_1$ in the first branch of the DAC circuit 600 will be 2I+ΔI, and the current $I_2$ in the second branch of the DAC circuit 600 will be zero, as illustrated in FIG. 8E. Thus, in the fifth phase 750, the capacitive element C1 may have a current $I_{cap}$=2I+ΔI (=$I_1$-$I_2$) flowing from the first terminal to the second terminal, representing a second dynamic current mismatch (e.g., 2I+ΔI=$I_{ref}$+$I_i$) between the current source 430 of the DAC cell 401; and the reference current source 630, as shown in the timing diagram 800E.

Figure 8F:
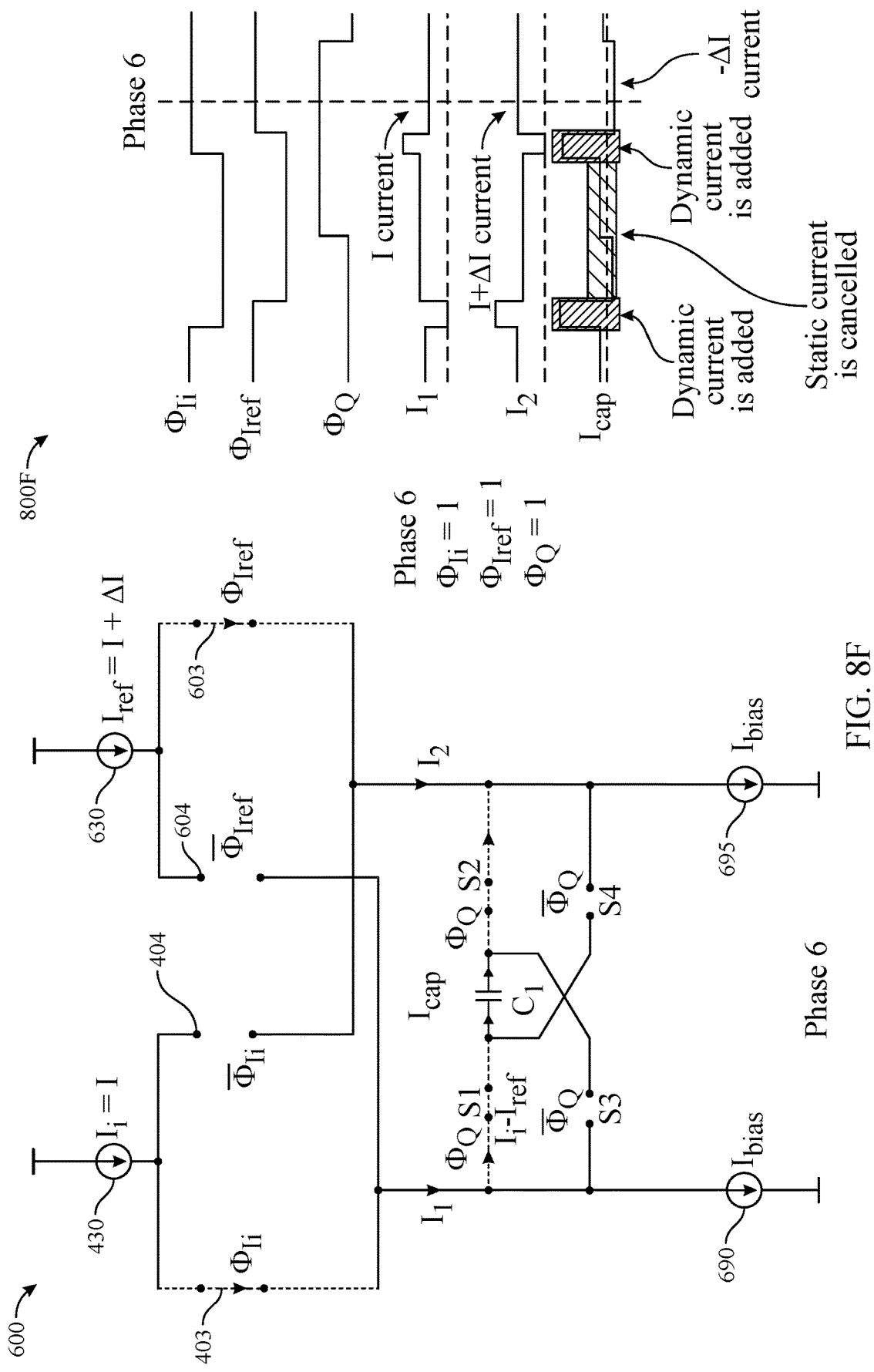

After the fifth phase 750, the operations 700 may proceed to a sixth phase 760, which involves static current mismatch cancellation with the static current mismatch accumulation from the fourth phase 740, with control signal $\Phi_Q$ being logic high. As shown in the timing diagram 800F of FIG. 8F for the sixth phase 760, the control signal $\Phi_{I_i}$ output by the first driver 660 remains logic high, the control signal $\Phi_{I_{ref}}$ output by the second driver 670 has changed to logic high, and the control signal $\Phi_Q$ output by the third driver 680 remains logic high. As a result, the positive switch 403, the reference positive switch 603, and the first set of switches S1, S2 are closed, and the negative switch 404, the reference negative switch 604, and the second set of switches S3, S4 are open, as shown in the DAC circuit 600 illustrated in FIG. 8F. In this case, keeping with the same assumptions as above, the current $I_1$ in the first branch of the DAC circuit 600 will be I, and the current $I_2$ in the second branch of the DAC circuit 600 will be I+ΔI, as illustrated in FIG. 8F. Thus, in the sixth phase 760, the capacitive element C1 may have a current $I_{cap}$=-ΔI(=$I_1$-$I_2$) flowing from the first terminal to the second terminal, representing a fourth static current mismatch (e.g., -ΔI=$I_i$-$I_{ref}$) between the current source 430 of the DAC cell 401; and the reference current source. The fourth static current mismatch from the sixth phase 760 may have nearly equal magnitude as, but opposite polarity to, the third static current mismatch from the fourth phase 740, such that the fourth static current mismatch cancels, or at least reduces, an effect of the third static current mismatch in the integration, if the lengths of the phases 740, 760 are controlled to be the same.

The current mismatches from all six phases may be integrated by the integrator 610. Due to the effective cancellation (or at least reduction) of the four static current mismatches, the first dynamic current mismatch and the second dynamic current mismatch may be effectively added by the integrator 610 to form a total dynamic current mismatch for the DAC cell 401;.

As an additional benefit of flipping the polarity of the capacitive element C1, the operations 700 may cancel, or at least reduce, the bias current mismatch between the current sinks 690, 695 in the DAC circuit 600. In some cases, the bias current mismatch between the current sinks 690, 695 may accumulate during the first phase 710, the second phase 720, and the third phase 730 and may be canceled, or at least reduced, during the fourth phase 740, the fifth phase 750, and the sixth phase 760.

As illustrated by the control signal $\Phi_Q$ in the timing diagram 800F of FIG. 8F, the first set of switches S1, S2 and the second set of switches S3, S4 may be configured to operate such that during a period for determining a total dynamic current mismatch for the DAC cell 401; (e.g., a duration of the operations 700), the capacitive element C1 has a first polarity for one half of the time in the period (e.g., during the first phase 710, the second phase 720, and the third phase 730) and a second polarity for another half of the time in the period (e.g., during the fourth phase 740, the fifth phase 750, and the sixth phase 760). In other words, the control signal $\Phi_Q$ is operated with a 50% duty cycle for one period covering the six phases.

According to certain aspects, the operations 700 may be repeated to generate a total dynamic current mismatch for each DAC cell 401; of the plurality of DAC cells 401. Relative time-delay values between each of the plurality of DAC cells 401 and the reference cell 401$_{ref}$ may be determined based on the total dynamic current for each DAC cell 401;, based on integrating the charges on the capacitor, as described above. The total dynamic current mismatch for each DAC cell 401; and/or the relative time-delay value for each DAC cell 401; may be stored in memory (e.g., in memory 242 or 282) included in or coupled to the DAC circuit 600 during, for example, calibration of the DAC. The DAC cells 401 may be effectively reordered based on the relative time-delay values, as described above, for normal operation of the DAC, with decreased dynamic nonlinearity and enhanced performance.

Example DAC Cell Reordering

Figure 9:
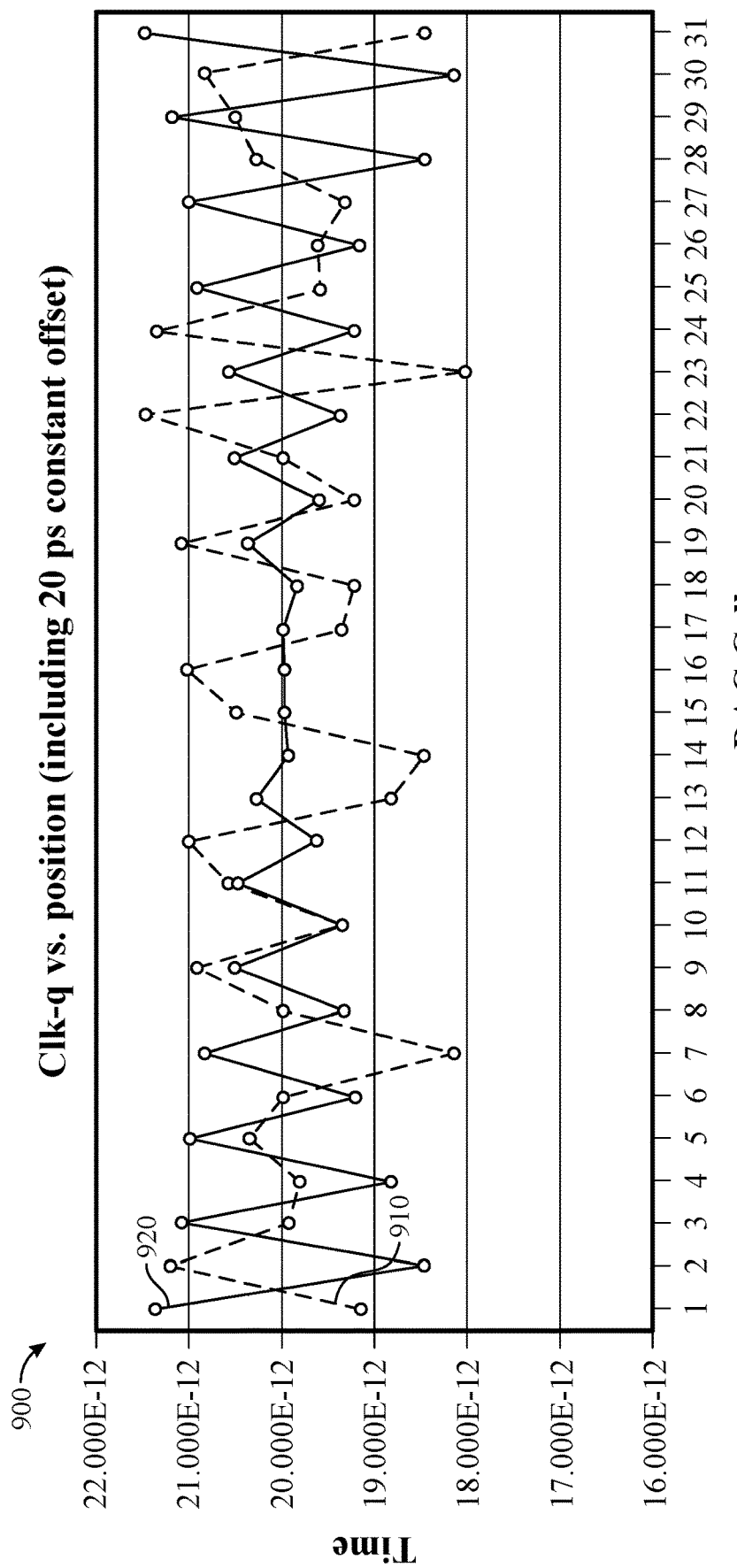
FIG. 9 illustrates plots of relative delay differences, based on the total dynamic current mismatches, for each of multiple DAC cells before and after DAC cell reordering, in accordance with certain aspects of the present disclosure.

FIG. 9 illustrates a graph 900 of example relative time-delay mismatches (in picoseconds (ps)) for each of multiple DAC cells, in accordance with certain aspects of the present disclosure. The relative time-delay mismatches may be based on total dynamic current mismatches, which may be determined as described above. Curve 910 represents the DAC cells before reordering, whereas curve 920 represents the DAC cells after reordering. In this example, the DAC cells with the lowest relative time-delay mismatch are effectively reordered in the middle of the DAC range, and DAC cells with increasingly higher relative time-delay mismatches are effectively reordered further and further away from the middle, as depicted in curve 920. As such, reordering the DAC cells according to their relative time-delay mismatches may result in improved dynamic nonlinearity during normal operation of the DAC.

Example DAC Calibration Operations

Figure 10:
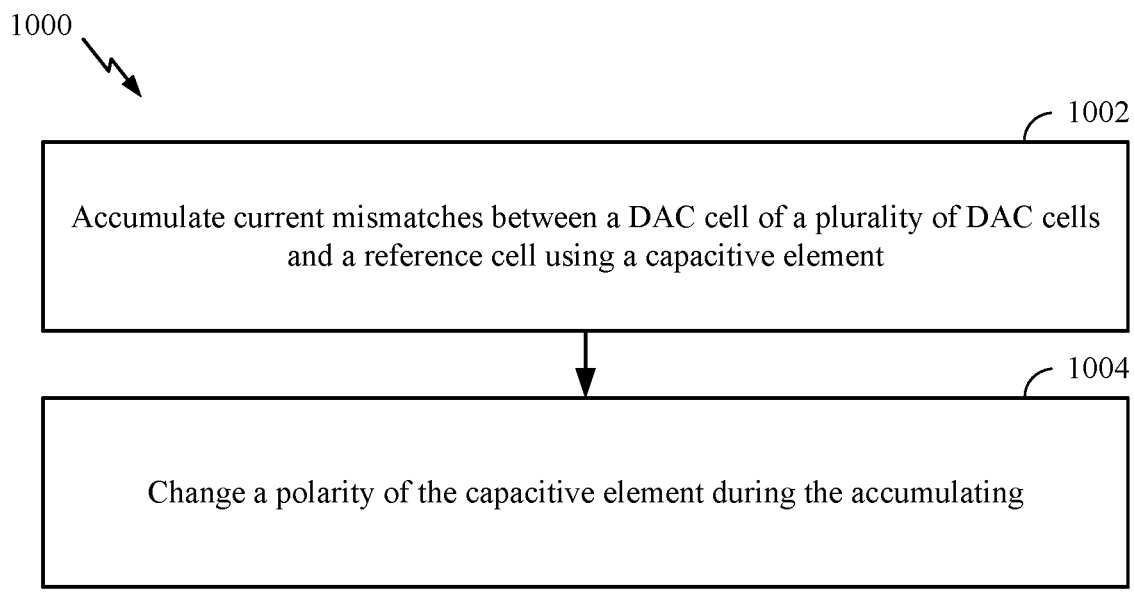
FIG. 10 is a flow diagram of example operations for DAC calibration, in accordance with certain aspects of the present disclosure.

FIG. 10 is a flow diagram of example operations 1000 for DAC calibration, in accordance with certain aspects of the present disclosure. The operations 1000 may be performed by a DAC circuit (e.g., DAC circuit 600). In certain aspects, the operations 1000 may occur during calibration of a DAC (e.g., a current-steering DAC 400 having a plurality of DAC cells 401) in the DAC circuit.

The operations 1000 may include, at block 1002, accumulating current mismatches between a DAC cell (e.g., DAC cell $401_i$) of a plurality of DAC cells (e.g., DAC cells 401) and a reference cell (e.g., reference cell $401_{ref}$) using a capacitive element (e.g., capacitive element C1). In certain aspects, timing of the accumulating may be controlled (e.g., by a controller, such as the controller 336) such that a static current mismatch between the DAC cell and the reference cell is canceled (or at least reduced) and a dynamic current mismatch between the DAC cell and the reference cell is enhanced. The accumulating at block 1002 may include using an integrator (e.g., integrator 610) including differential inputs coupled across the capacitive element. In this case, the timing of the accumulating may be controlled such that the dynamic current mismatch between the DAC cell and the reference cell is integrated by the integrator. The reference cell may be one of the plurality of DAC cells selected to be the reference cell or may be a separate, additional cell.

The operations 1000 may include, at block 1004, changing a polarity of the capacitive element during the accumulating. In certain aspects, changing the polarity of the capacitive element at block 1004 may include: (i) opening a first set of switches (e.g., the first switch S1 and the second switch S2) selectively coupling a first terminal of the capacitive element to a DAC output node (e.g., DAC output node 640) and a second terminal of the capacitive element to a complementary DAC output node (e.g., complementary DAC output node 650), and (ii) closing a second set of switches (e.g., the third switch S3 and the fourth switch S4) selectively coupling the second terminal of the capacitive element to the DAC output node and the first terminal of the capacitive element to the complementary DAC output node. In certain aspects, during the accumulating and for a period for determining a total dynamic current mismatch for the DAC cell, the first set of switches and the second set of switches may be controlled to operate such that the capacitive element has a first polarity (e.g., $I_{cap}=I_2-I_1$) for one half of the time in the period (e.g., during phases 710, 720, 730) and a second polarity (e.g., $I_{cap}=I_1-I_2$) for another half of the time in the period (e.g., during phases 740, 750, 760).

According to certain aspects, during a first phase (e.g., first phase 710) of the accumulating, the accumulating at block 1002 may include controlling a plurality of switches (e.g., the positive switch 403, the negative switch 404, the reference positive switch 603, the reference negative switch 604, the first switch S1, the second switch S2, the third switch S3, and/or the fourth switch S4) to accumulate, on the capacitive element, a first static current mismatch (e.g., $\Delta I$) between a current source included in the DAC cell and a reference current source (e.g., reference current source 630) included in the reference cell (e.g., $I_{ref}-I_i$) (or at least what is considered or modeled to be the DAC cell's current source and the reference current source, due to the delay differences between the DAC cell and the reference cell causing current mismatches).

According to certain aspects, during a second phase (e.g., second phase 720) of the accumulating, the accumulating at block 1002 may include controlling the plurality of switches to accumulate, on the capacitive element, a first dynamic current mismatch (e.g., $2I+\Delta I$) between the current source included in the DAC cell and the reference current source included in the reference cell (e.g., $I_{ref}+I_i$).

According to certain aspects, during a third phase (e.g., third phase 730) of the accumulating, the accumulating at block 1002 may include controlling the plurality of switches to accumulate, using the capacitive element, a second static current mismatch (e.g., $-\Delta I$) between the current source included in the DAC cell and the reference current source included in the reference cell (e.g., $I_i-I_{ref}$). The second static current mismatch may have nearly the same magnitude and a polarity opposite to a polarity of the first static current mismatch that cancels (or at least reduces) an effect of the first static current mismatch.

According to certain aspects, during a fourth phase (e.g., fourth phase 740) of the accumulating, the accumulating at block 1002 may include controlling the plurality of switches to accumulate, using the capacitive element, a third static current mismatch (e.g., $\Delta I$) between the current source and the reference current source (e.g., $I_{ref}-I_i$).

According to certain aspects, during a fifth phase (e.g., fifth phase 750) of the accumulating, the accumulating at block 1002 may include controlling the plurality of switches to accumulate, using the capacitive element, a second dynamic current mismatch (e.g., $2I+\Delta I$) between the current source and the reference current source. The first dynamic current mismatch and the second dynamic current mismatch may be combined (through integration) to form a total dynamic current mismatch for the DAC cell.

According to certain aspects, during a sixth phase (e.g., sixth phase 760) of the accumulating, the accumulating at block 1002 may include controlling the plurality of switches to accumulate, using the capacitive element, a fourth static current mismatch (e.g., $-\Delta I$) between the current source and the reference current source (e.g., $I_i-I_{ref}$). The fourth static current mismatch may have a polarity opposite to a polarity of the third static current mismatch that cancels (or at least reduces) an effect of the third static current mismatch.

According to certain aspects, the operations 1000 may further include repeating the accumulating for each DAC cell in the plurality of DAC cells to generate a plurality of accumulated current mismatches, based on the plurality of accumulated current mismatches, determining relative time-delay values between each of the plurality of DAC cells and the reference cell, and effectively reordering the plurality of DAC cells based on the relative time-delay values. In other words, the operations 1000 may be repeated for each DAC cell of the plurality of DAC cells.

According to certain aspects, the relative time-delay values may be stored in memory.

Example Aspects

In addition to the various aspects described above, specific combinations of aspects are within the scope of the present disclosure, some of which are detailed below:

Aspect 1: A digital-to-analog converter (DAC) circuit comprising: a plurality of DAC cells, each DAC cell comprising a current source, a first switch coupled between the current source and a DAC output node, and a second switch coupled between the current source and a complementary DAC output node; a reference cell comprising a reference current source, a third switch coupled between the reference current source and the complementary DAC output node, and a fourth switch coupled between the reference current source and the DAC output node; a capacitive element; an integrator comprising a first input coupled to a first terminal of the capacitive element and a second input coupled to a second terminal of the capacitive element; a first set of switches configured to selectively couple the first terminal of the capacitive element to the DAC output node and the second terminal of the capacitive element to the complementary DAC output node; and a second set of switches configured to selectively couple the second terminal of the capacitive element to the DAC output node and the first terminal of the capacitive element to the complementary DAC output node.

Aspect 2: The DAC circuit of Aspect 1, wherein the reference cell is one of the plurality of DAC cells.

Aspect 3: The DAC circuit of Aspect 1 or 2, wherein during a first phase: the first switch, the third switch, and the second set of switches are configured to be closed; the second switch, the fourth switch, and the first set of switches are configured to be open; and the capacitive element is configured to accumulate a first static current mismatch between the current source of the DAC cell and the reference current source.

Aspect 4: The DAC circuit of Aspect 3, wherein during a second phase: the second switch, the third switch, and the second set of switches are configured to be closed; the first switch, the fourth switch, and the first set of switches are configured to be open; and the capacitive element is configured to accumulate a first dynamic current mismatch between the current source of the DAC cell and the reference current source.

Aspect 5: The DAC circuit of Aspect 4, wherein during a third phase: the second switch, the fourth switch, and the second set of switches are configured to be closed; the first switch, the third switch, and the first set of switches are configured to be open; and the capacitive element is configured to accumulate a second static current mismatch between the current source of the DAC cell and the reference current source, the second static current mismatch having opposite polarity to the first static current mismatch that at least reduces an effect of the first static current mismatch.

Aspect 6: The DAC circuit of Aspect 5, wherein during a fourth phase: the second switch, the fourth switch, and the first set of switches are configured to be closed; the first switch, the third switch, and the second set of switches are configured to be open; and the capacitive element is configured to accumulate a third static current mismatch between the current source of the DAC cell and the reference current source.

Aspect 7: The DAC circuit of Aspect 6, wherein during a fifth phase: the first switch, the fourth switch, and the first set of switches are configured to be closed; the second switch, the third switch, and the second set of switches are configured to be open; and the capacitive element is configured to accumulate a second dynamic current mismatch between the current source of the DAC cell and the reference current source, the first dynamic current mismatch and the second dynamic current mismatch forming a total dynamic current mismatch for the DAC cell.

Aspect 8: The DAC circuit of Aspect 7, wherein during a sixth phase: the first switch, the third switch, and the first set of switches are configured to be closed; the second switch, the fourth switch, and the second set of switches are configured to be open; and the capacitive element is configured to accumulate a fourth static current mismatch between the current source of the DAC cell and the reference current source, the fourth static current mismatch having opposite polarity to the third static current mismatch that at least reduces an effect of the third static current mismatch.

Aspect 9: The DAC circuit according to any of Aspects 1-8, wherein the first set of switches and the second set of switches are configured to operate such that during a period for determining a total dynamic current mismatch for the DAC cell, the capacitive element has a first polarity for one half of the time in the period and a second polarity for another half of the time in the period.

Aspect 10: The DAC circuit according to any of Aspects 1-9, wherein the first switch is configured to be controlled by a first clock signal and wherein the second set of switches is configured to be controlled by a second clock signal having a quadrature relationship with the first clock signal.

Aspect 11: A wireless device comprising the DAC circuit according to any of Aspects 1-10, the wireless device further comprising: at least one antenna; and at least one transmit path coupled between the DAC output node and the antenna.

Aspect 12: A method of digital-to-analog converter (DAC) calibration, comprising: accumulating current mismatches between a DAC cell of a plurality of DAC cells and a reference cell using a capacitive element; and changing a polarity of the capacitive element during the accumulating.

Aspect 13: The method of Aspect 12, wherein timing of the accumulating is controlled such that a static current mismatch between the DAC cell and the reference cell is at least reduced and a dynamic current mismatch between the DAC cell and the reference cell is enhanced.

Aspect 14: The method of Aspect 13, wherein the accumulating comprises using an integrator including differential inputs coupled across the capacitive element and wherein the timing of the accumulating is controlled such that the dynamic current mismatch between the DAC cell and the reference cell is integrated by the integrator.

Aspect 15: The method according to any of Aspects 12-14, wherein changing the polarity of the capacitive element comprises: opening a first set of switches selectively coupling a first terminal of the capacitive element to a DAC output node and a second terminal of the capacitive element to a complementary DAC output node; and closing a second set of switches selectively coupling the second terminal of the capacitive element to the DAC output node and the first terminal of the capacitive element to the complementary DAC output node.

Aspect 16: The method of Aspect 15, wherein during the accumulating and for a period for determining a total dynamic current mismatch for the DAC cell, the first set of switches and the second set of switches are controlled to operate such that the capacitive element has a first polarity for one half of the time in the period and a second polarity for another half of the time in the period.

Aspect 17: The method according to any of Aspects 12-16, wherein during a first phase of the accumulating, the accumulating comprises controlling a plurality of switches to accumulate, on the capacitive element, a first static current mismatch between a current source included in the DAC cell and a reference current source included in the reference cell.

Aspect 18: The method of Aspect 17, wherein during a second phase of the accumulating, the accumulating comprises controlling the plurality of switches to accumulate, on the capacitive element, a first dynamic current mismatch between the current source included in the DAC cell and the reference current source included in the reference cell.

Aspect 19: The method of Aspect 18, wherein during a third phase of the accumulating, the accumulating comprises controlling the plurality of switches to accumulate, using the capacitive element, a second static current mismatch between the current source included in the DAC cell and the reference current source included in the reference cell, the second static current mismatch having opposite polarity to the first static current mismatch that at least reduces an effect of the first static current mismatch.

Aspect 20: The method of Aspect 19, wherein during a fourth phase of the accumulating, the accumulating comprises controlling the plurality of switches to accumulate, using the capacitive element, a third static current mismatch between the current source and the reference current source.

Aspect 21: The method of Aspect 20, wherein during a fifth phase of the accumulating, the accumulating comprises controlling the plurality of switches to accumulate, using the capacitive element, a second dynamic current mismatch between the current source and the reference current source, the first dynamic current mismatch and the second dynamic current mismatch forming a total dynamic current mismatch for the DAC cell.

Aspect 22: The method of Aspect 21, wherein during a sixth phase of the accumulating, the accumulating comprises controlling the plurality of switches to accumulate, using the capacitive element, a fourth static current mismatch between the current source and the reference current source, the fourth static current mismatch having opposite polarity to the third static current mismatch that at least reduces an effect of the third static current mismatch.

Aspect 23: The method according to any of Aspects 12-22, further comprising: repeating the accumulating for each DAC cell in the plurality of DAC cells to generate a plurality of accumulated current mismatches; based on the plurality of accumulated current mismatches, determining relative time-delay values between each of the plurality of DAC cells and the reference cell; and effectively reordering the plurality of DAC cells based on the relative time-delay values.

Aspect 24: The method according to any of Aspects 12-23, wherein the reference cell is one of the plurality of DAC cells.

Aspect 25: An apparatus capable of digital-to-analog conversion, comprising: means for accumulating current mismatches between a digital-to-analog converter (DAC) cell of a plurality of DAC cells and a reference cell using a capacitive element; and means for changing a polarity of the capacitive element during the accumulating.

Additional Considerations

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. For example, means for accumulating current mismatches between a DAC cell of a plurality of DAC cells and a reference cell may include a capacitive element, such as the capacitive element C1 of FIG. 6, and/or an integrator, such as the integrator 610 of FIG. 6. Means for changing a polarity of the capacitive element during the accumulating may include a plurality of switches, such as the first set of switches S1, S2 and the second set of switches S3, S4 of FIG. 6.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A digital-to-analog converter (DAC) circuit comprising:
   a plurality of DAC cells, each DAC cell comprising a current source, a first switch coupled between the current source and a DAC output node, and a second switch coupled between the current source and a complementary DAC output node;
   a reference cell comprising a reference current source, a third switch coupled between the reference current source and the complementary DAC output node, and a fourth switch coupled between the reference current source and the DAC output node;
   a capacitive element;
   an integrator comprising a first input coupled to a first terminal of the capacitive element and a second input coupled to a second terminal of the capacitive element;
   a first set of switches configured to selectively couple the first terminal of the capacitive element to the DAC output node and the second terminal of the capacitive element to the complementary DAC output node; and
   a second set of switches configured to selectively couple the second terminal of the capacitive element to the DAC output node and the first terminal of the capacitive element to the complementary DAC output node.

2. The DAC circuit of claim 1, wherein the reference cell is one of the plurality of DAC cells.

3. The DAC circuit of claim 1, wherein during a first phase:
the first switch, the third switch, and the second set of switches are configured to be closed;
the second switch, the fourth switch, and the first set of switches are configured to be open; and
the capacitive element is configured to accumulate a first static current mismatch between the current source of the DAC cell and the reference current source.

4. The DAC circuit of claim 3, wherein during a second phase:
the second switch, the third switch, and the second set of switches are configured to be closed;
the first switch, the fourth switch, and the first set of switches are configured to be open; and
the capacitive element is configured to accumulate a first dynamic current mismatch between the current source of the DAC cell and the reference current source.

5. The DAC circuit of claim 4, wherein during a third phase:
the second switch, the fourth switch, and the second set of switches are configured to be closed;
the first switch, the third switch, and the first set of switches are configured to be open; and
the capacitive element is configured to accumulate a second static current mismatch between the current source of the DAC cell and the reference current source, the second static current mismatch having opposite polarity to the first static current mismatch that at least reduces an effect of the first static current mismatch.

6. The DAC circuit of claim 5, wherein during a fourth phase:
the second switch, the fourth switch, and the first set of switches are configured to be closed;
the first switch, the third switch, and the second set of switches are configured to be open; and
the capacitive element is configured to accumulate a third static current mismatch between the current source of the DAC cell and the reference current source.

7. The DAC circuit of claim 6, wherein during a fifth phase:
the first switch, the fourth switch, and the first set of switches are configured to be closed;
the second switch, the third switch, and the second set of switches are configured to be open; and
the capacitive element is configured to accumulate a second dynamic current mismatch between the current source of the DAC cell and the reference current source, the first dynamic current mismatch and the second dynamic current mismatch forming a total dynamic current mismatch for the DAC cell.

8. The DAC circuit of claim 7, wherein during a sixth phase:
the first switch, the third switch, and the first set of switches are configured to be closed;
the second switch, the fourth switch, and the second set of switches are configured to be open; and
the capacitive element is configured to accumulate a fourth static current mismatch between the current source of the DAC cell and the reference current source, the fourth static current mismatch having opposite polarity to the third static current mismatch that at least reduces an effect of the third static current mismatch.

9. The DAC circuit of claim 1, wherein the first set of switches and the second set of switches are configured to operate such that during a period for determining a total dynamic current mismatch for the DAC cell, the capacitive element has a first polarity for one half of the time in the period and a second polarity for another half of the time in the period.

10. The DAC circuit of claim 1, wherein the first switch is configured to be controlled by a first clock signal and wherein the second set of switches is configured to be controlled by a second clock signal having a quadrature relationship with the first clock signal.

11. A method of digital-to-analog converter (DAC) calibration, comprising:
accumulating current mismatches between a DAC cell of a plurality of DAC cells and a reference cell using a capacitive element; and
changing a polarity of the capacitive element during the accumulating.

12. The method of claim 11, wherein timing of the accumulating is controlled such that a static current mismatch between the DAC cell and the reference cell is at least reduced and a dynamic current mismatch between the DAC cell and the reference cell is enhanced.

13. The method of claim 12, wherein the accumulating comprises using an integrator including differential inputs coupled across the capacitive element and wherein the timing of the accumulating is controlled such that the dynamic current mismatch between the DAC cell and the reference cell is integrated by the integrator.

14. The method of claim 11, wherein changing the polarity of the capacitive element comprises:
opening a first set of switches selectively coupling a first terminal of the capacitive element to a DAC output node and a second terminal of the capacitive element to a complementary DAC output node; and
closing a second set of switches selectively coupling the second terminal of the capacitive element to the DAC output node and the first terminal of the capacitive element to the complementary DAC output node.

15. The method of claim 14, wherein during the accumulating and for a period for determining a total dynamic current mismatch for the DAC cell, the first set of switches and the second set of switches are controlled to operate such that the capacitive element has a first polarity for one half of the time in the period and a second polarity for another half of the time in the period.

16. The method of claim 11, wherein during a first phase of the accumulating, the accumulating comprises controlling a plurality of switches to accumulate, on the capacitive element, a first static current mismatch between a current source included in the DAC cell and a reference current source included in the reference cell.

17. The method of claim 16, wherein during a second phase of the accumulating, the accumulating comprises controlling the plurality of switches to accumulate, on the capacitive element, a first dynamic current mismatch between the current source included in the DAC cell and the reference current source included in the reference cell.

18. The method of claim 17, wherein during a third phase of the accumulating, the accumulating comprises controlling the plurality of switches to accumulate, using the capacitive element, a second static current mismatch between the current source included in the DAC cell and the reference current source included in the reference cell, the second static current mismatch having opposite polarity to the first static current mismatch that at least reduces an effect of the first static current mismatch.

19. The method of claim 18, wherein during a fourth phase of the accumulating, the accumulating comprises controlling the plurality of switches to accumulate, using the capacitive element, a third static current mismatch between the current source and the reference current source.

20. The method of claim 19, wherein:
- during a fifth phase of the accumulating, the accumulating comprises controlling the plurality of switches to accumulate, using the capacitive element, a second dynamic current mismatch between the current source and the reference current source, the first dynamic current mismatch and the second dynamic current mismatch forming a total dynamic current mismatch for the DAC cell; and
- during a sixth phase of the accumulating, the accumulating comprises controlling the plurality of switches to accumulate, using the capacitive element, a fourth static current mismatch between the current source and the reference current source, the fourth static current mismatch having opposite polarity to the third static current mismatch that at least reduces an effect of the third static current mismatch.

\* \* \* \* \*